US010199568B2

(12) United States Patent
Nagamine et al.

(10) Patent No.: US 10,199,568 B2
(45) Date of Patent: Feb. 5, 2019

(54) MAGNETIC STORAGE DEVICE AND MANUFACTURING METHOD OF MAGNETIC STORAGE DEVICE

(71) Applicant: TOSHIBA MEMORY CORPORATION, Minato-ku, Tokyo (JP)

(72) Inventors: Makoto Nagamine, Seoul (KR); Young Min Eeh, Seongnam-si (KR); Daisuke Watanabe, Seoul (KR); Kazuya Sawada, Seoul (KR); Toshihiko Nagase, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/261,619

(22) Filed: Sep. 9, 2016

(65) Prior Publication Data
US 2017/0263855 A1    Sep. 14, 2017

Related U.S. Application Data

(60) Provisional application No. 62/306,346, filed on Mar. 10, 2016.

(51) Int. Cl.
*H01L 43/08* (2006.01)
*H01L 43/12* (2006.01)
*H01L 27/22* (2006.01)

(52) U.S. Cl.
CPC ............ *H01L 43/08* (2013.01); *H01L 27/228* (2013.01); *H01L 43/12* (2013.01)

(58) Field of Classification Search
CPC ........ G01R 33/09; G01R 33/098; G11B 5/39; G11B 5/3909; G11C 2211/5615; G11C 2211/562; G11C 14/0036; G11C 14/0081; H01L 27/222

See application file for complete search history.

(56) References Cited

U.S. PATENT DOCUMENTS

| 2003/0235070 | A1  | 12/2003 | Ooishi | |
| 2012/0193601 | A1* | 8/2012  | Tsukamoto | G11C 11/16 257/5 |
| 2014/0328116 | A1* | 11/2014 | Guo | G11C 11/161 365/158 |
| 2016/0268338 | A1* | 9/2016  | Kashiwada | H01L 27/228 |

OTHER PUBLICATIONS

Pushp et al. ("Giant thermal spin-torque-assisted magnetic tunnel junction switching," PNAS, vol. 12, No. 21, pp. 6585-6590, May 26, 2015).*

* cited by examiner

*Primary Examiner* — Yasser A Abdelaziez
(74) *Attorney, Agent, or Firm* — Holtz, Holtz & Volek PC

(57) ABSTRACT

According to one embodiment, a magnetic storage device includes a substrate, a dummy contact disposed on a top surface of the substrate, extending linearly in a direction substantially perpendicular to the top surface of the substrate, and floating electrically, and a magnetoresistive effect element included in a layer and insulated from the dummy contact, wherein the layer is disposed on the top surface of the dummy contact.

3 Claims, 26 Drawing Sheets

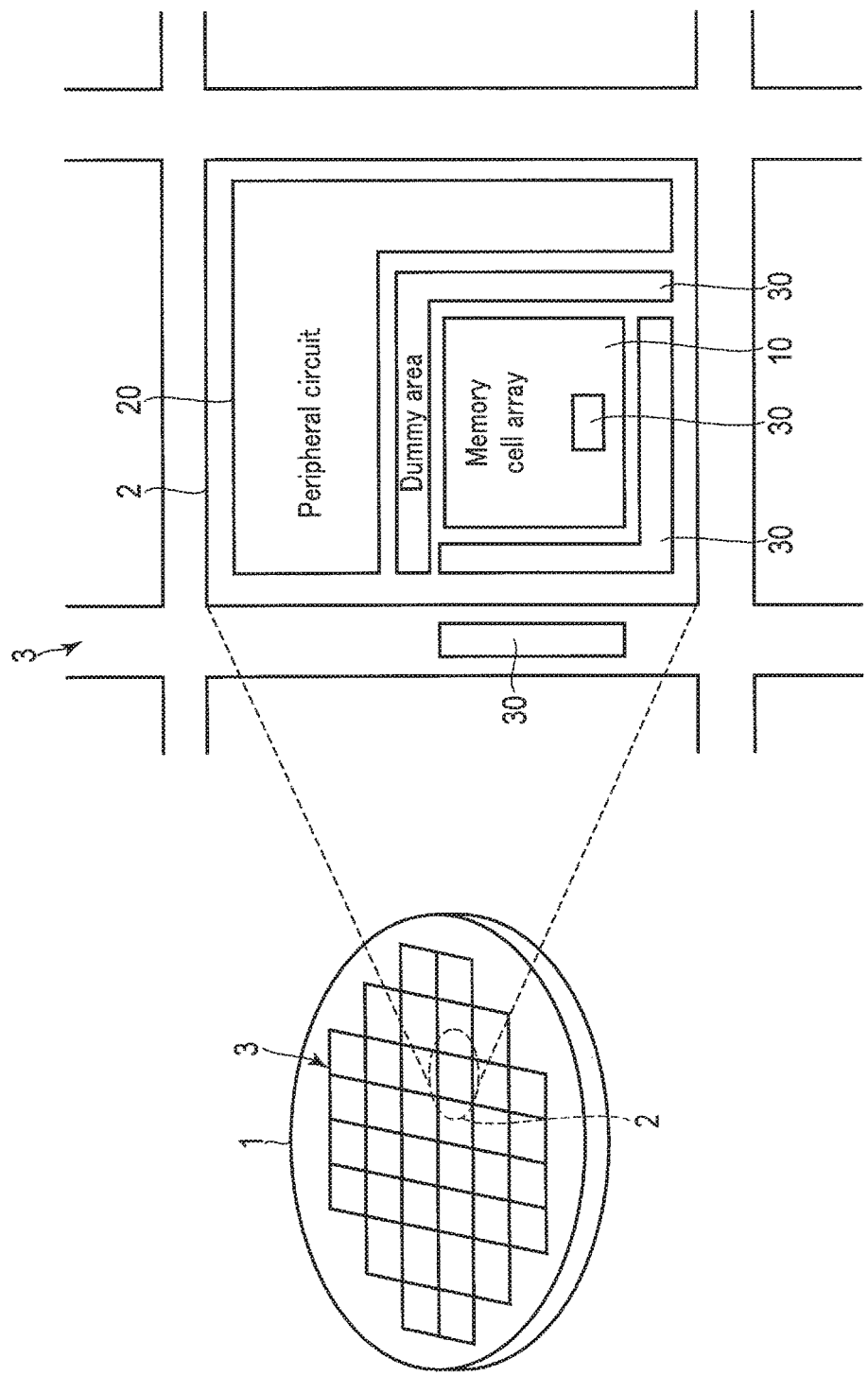
F I G. 1

F.I.G. 2

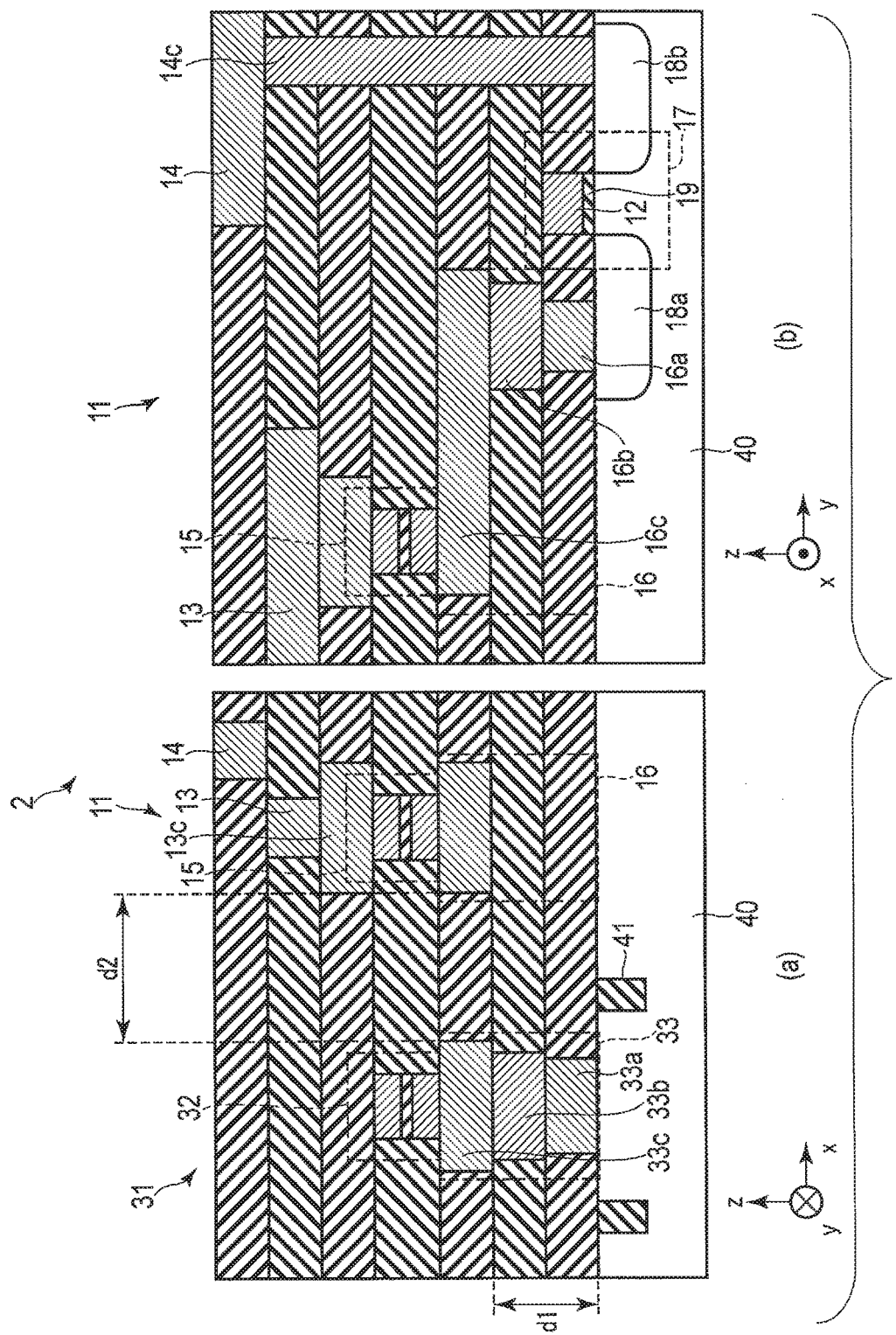
F I G. 3

| | Thermal conductivity [W/m k] | Heat capacity [J/k mol] |
|---|---|---|
| SiO2 | 1.38 | 45 |
| SiN | 1.9 | 45 |
| Hf | 23 | 26 |
| TiN | 29 | 25.4 |
| Ta | 57.5 | 29 |
| Fe | 80.3 | 25 |
| Si | 148 | 20 |
| Cu | 398 | 24 |

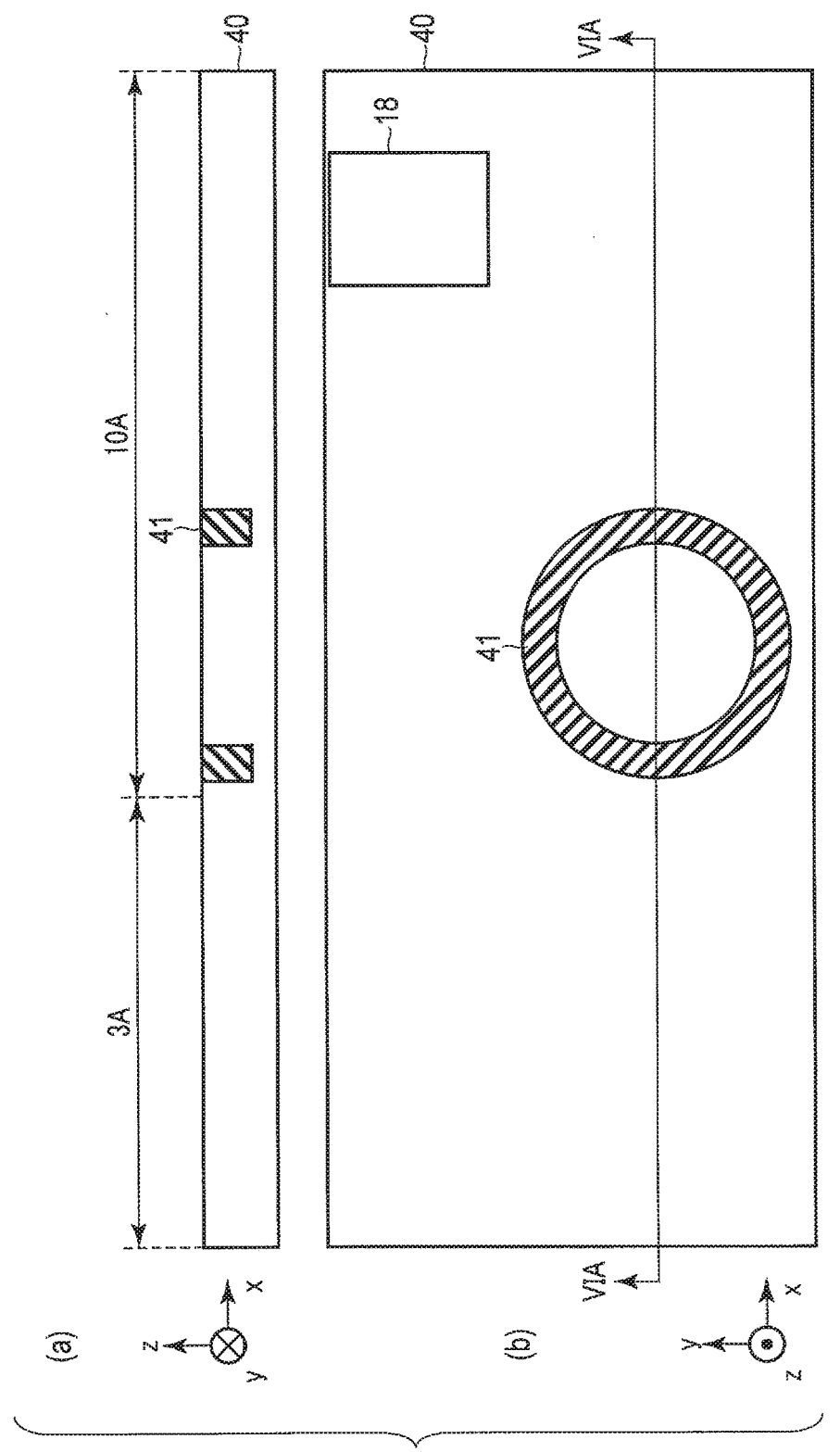
F I G. 6

F.I.G. 7

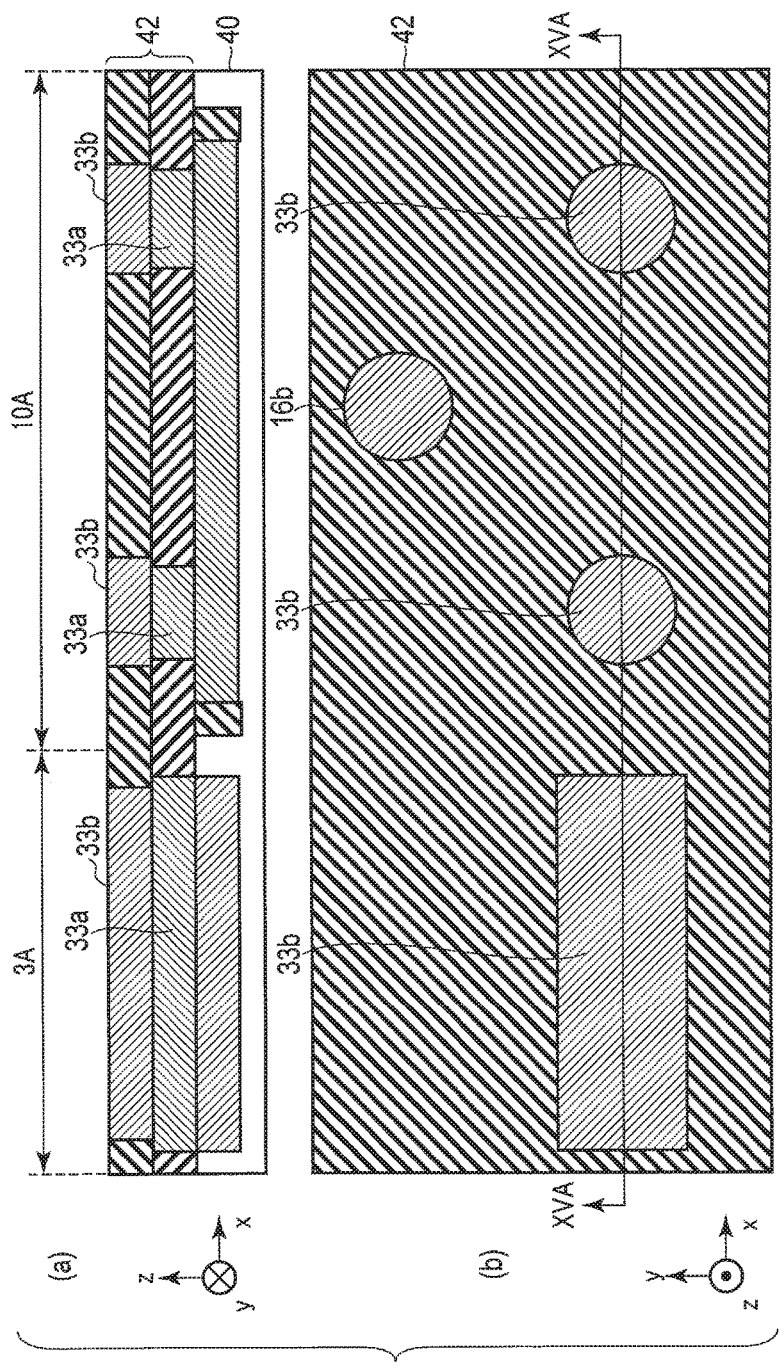
F I G. 15

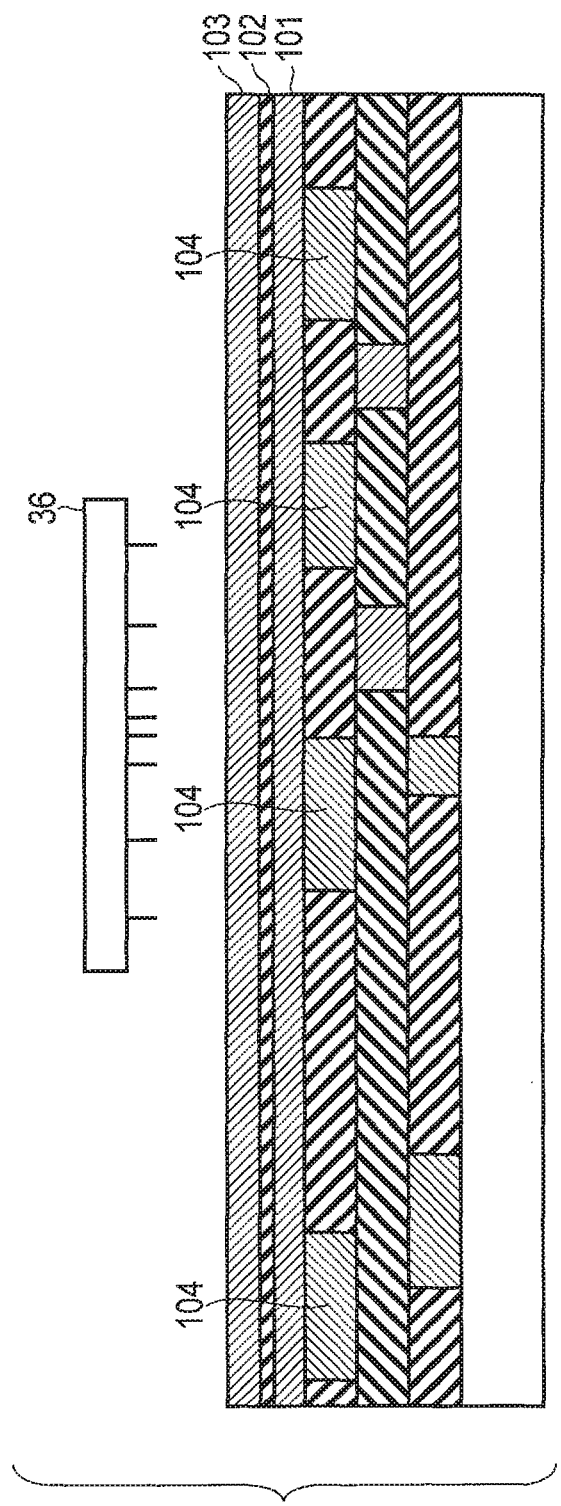
F I G. 21

MAGNETIC STORAGE DEVICE AND MANUFACTURING METHOD OF MAGNETIC STORAGE DEVICE

CROSS-REFERENCE TO RELATED APPLICATIONS

This application claims the benefit of U.S. Provisional Application No. 62/306,346, filed Mar. 10, 2016, the entire contents of which are incorporated herein by reference.

FIELD

Embodiments described herein relate generally to a magnetic storage device and a manufacturing method of a magnetic storage device.

BACKGROUND

As a storage device included in a memory system, there is known a magnetic storage device (MRAM: Magnetoresistive Random Access Memory) which employs a magnetoresistive effect element as a memory element.

The magnetic storage device includes, for example, a magnetoresistive effect element as a memory element. The magnetoresistive effect element includes a storage layer with magnetization, a reference layer, and a tunnel barrier layer. The magnetoresistive effect element can store data semipermanently, for example, by setting the magnetization orientation of the storage layer to be either parallel or antiparallel to the magnetization orientation of the reference layer. The magnetic storage device sets the magnetization orientation of the storage layer, for example, by causing a magnetization reversal current to flow through the magnetoresistive effect element.

BRIEF DESCRIPTION OF THE DRAWINGS

FIG. 1 is a schematic view showing a configuration example of a magnetic storage device according to a first embodiment;

FIG. 3 is a sectional view showing a configuration example of a memory cell and a dummy cell of the magnetic storage device according to the first embodiment;

FIG. 6 is a schematic view showing a portion of a manufacturing method of the magnetic storage device according to the first embodiment;

FIG. 15 is a schematic view showing a portion of the manufacturing method of the magnetic storage device according to the second embodiment;

FIG. 21 is a schematic diagram to illustrate related technology;

DETAILED DESCRIPTION

Figure 2:
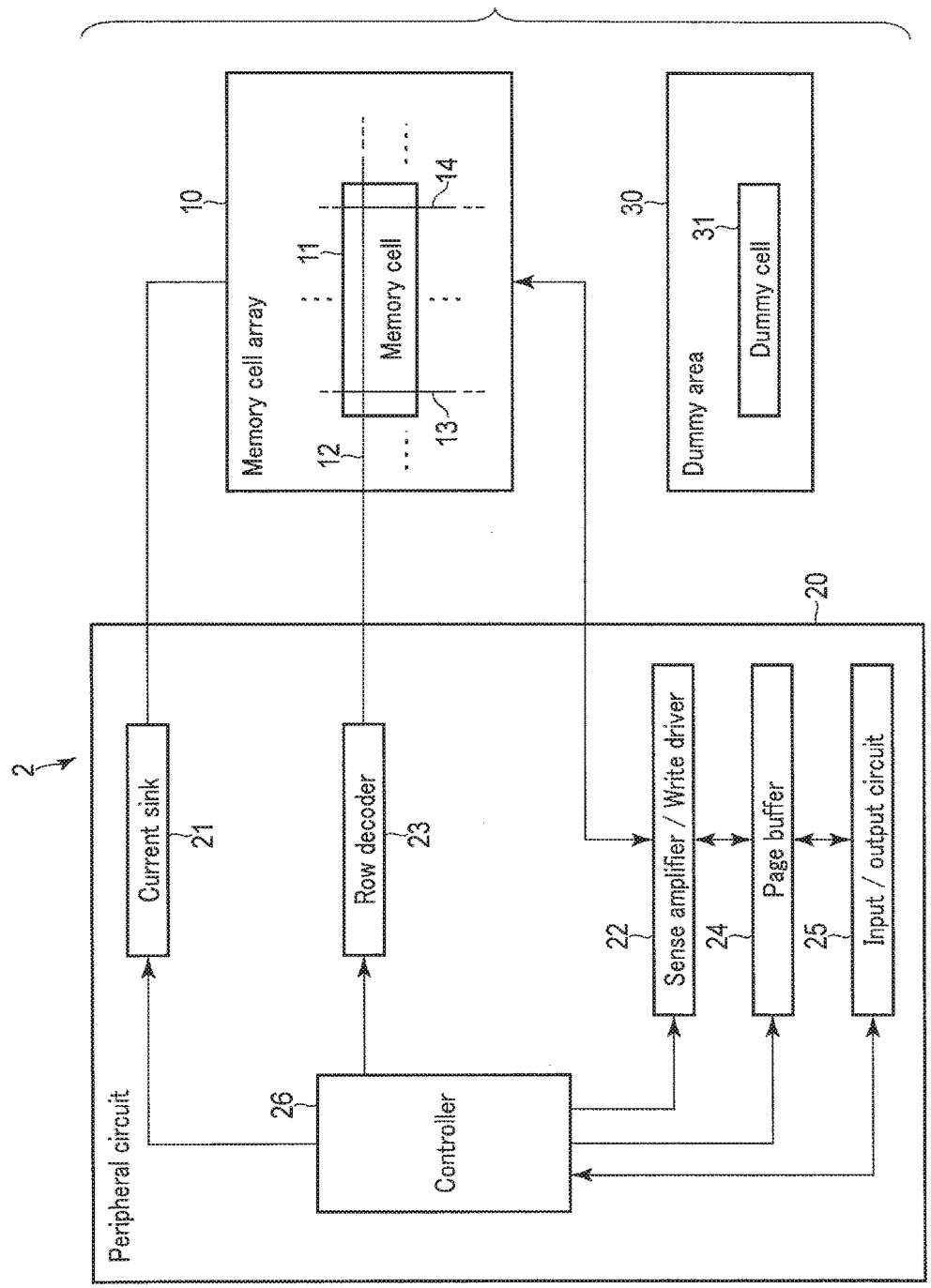
FIG. 2 is a block diagram showing a configuration example of the magnetic storage device according to the first embodiment.

In general, according to one embodiment, a magnetic storage device includes a substrate, a dummy contact disposed on a top surface of the substrate, extending linearly in a direction substantially perpendicular to the top surface of the substrate, and floating electrically, and a magnetoresistive effect element included in a layer and insulated from the dummy contact, wherein the layer is disposed on the top surface of the dummy contact.

Hereinafter, the embodiments will be described with reference to the drawings. In the description that follows, the same reference numerals are attached to components having substantially the same function and configuration and a duplicate description is provided only when necessary. Each embodiment shown below exemplifies an apparatus or a method of embodying technical ideas of the embodiment and technical ideas of an embodiment do not limit the materials, shapes, structures, arrangements and the like of components to those described below. Technical ideas of an embodiment can be modified in various ways in claims.

1. First Embodiment

A magnetic storage device according to the first embodiment will be described.

1.1 Configuration 1.1.1. Configuration of a Magnetic Storage Device

First, the configuration of a magnetic storage device according to the first embodiment will be described. The magnetic storage device according to the first embodiment is, for example, a magnetic storage device by a vertical magnetization method, which uses a magnetoresistive effect element (MTJ (Magnetic Tunnel Junction) element) as a memory element.

FIG. 1 is a schematic diagram of a magnetic storage device according to the first embodiment and is a schematic diagram showing the configuration of the magnetic storage device and an overview of a wafer on which a plurality of the magnetic storage devices is disposed. As shown in FIG. 1, a wafer 1 includes a plurality of magnetic storage devices 2 and a scribe line 3. The wafer 1 is made of, for example, single-crystal silicon and a plurality of circuits is disposed by various kinds of film formation treatment on the top surface of the wafer 1. The scribe line 3 is an area partitioning the wafer 1 into the magnetic storage devices 2. The scribe line 3 is used as a cut line when the magnetic storage device 2 is individually cut out from the wafer 1.

The magnetic storage device 2 includes a memory cell array 10, a peripheral circuit 20, and a dummy area 30. The memory cell array 10 is a circuit block in which memory cells storing data are disposed in a matrix shape. The peripheral circuit 20 is a generic name for a circuit block disposed on the periphery of the memory cell array 10 inside the magnetic storage device 2 and operates to write and read data stored in the memory cell array 10. The dummy area 30 is an area disposed in a peripheral area of the memory cell array 10 and including a circuit block that does not function as the magnetic storage device 2. Also, for example, the dummy area 30 may be disposed in a circuit-block area between the memory cell array 10 and the peripheral circuit 20 or an edge area between the memory cell array 10 and the scribe line 3. Also, for example, the dummy area 30 may be disposed in an area inside the memory cell array 10 or an area on the scribe line 3.

FIG. 2 is a block diagram showing the configuration of the magnetic storage device 2 according to the first embodiment. As shown in FIG. 2, the memory cell array 10 includes a plurality of memory cells 11 associated with a row and a column. Then, the memory cells 11 in the same row are connected to a same word line 12 and the memory cells 11 in the same column are connected to a same bit line 13 and a same source line 14. The peripheral circuit 20 includes a current sink 21, a sense amplifier/write driver (SA/WD) 22, a row decoder 23, a page buffer 24, a input/output circuit 25, and a controller 26.

The current sink 21 is connected to the bit line 13 and the source line 14. The current sink 21 sets the bit line 13 and the source line 14 to the ground potential for an operation such as writing or reading data.

The SA/WD 22 is connected to the bit line 13 and the source line 14. The SA/WD 22 supplies a current to the memory cell 11 to be operated via the bit line 13 and the source line 14 to write data to the memory cell 11. Also, the SA/WD 22 supplies a current to the memory cell 11 to be operated via the bit line 13 and the source line 14 to read data from the memory cell 11. More specifically, a write driver of the SA/WD 22 writes data into the memory cell 11 and a sense amplifier of the SA/WD 22 reads data from the memory cell 11.

The row decoder 23 is connected to the memory cell array 10 via the word line 12. The row decoder 23 decodes a row address specifying the row direction of the memory cell array 10. Then, the row decoder 23 selects the word line 12 in accordance with the decode result and applies a voltage needed for an operation such as writing data into the word line 12 selected or reading data therefrom.

The page buffer 24 temporarily holds data to be written into the memory cell array 10 or data read from the memory cell array 10 in the data unit called a page.

The input/output circuit 25 transmits various signals received from outside the magnetic storage device 2 to the controller 26 and the page buffer 24 and also transmits various kinds of information from the controller 26 and the page buffer 24 to the outside of the magnetic storage device 2.

The controller 26 is connected to the current sink 21, the SA/WD 22, the row decoder 23, the page buffer 24, and the input/output circuit 25. The controller 26 controls the current sink 21, the SA/WD 22, the row decoder 23, and the page buffer 24 according to various signals received by the input/output circuit 25 from outside the magnetic storage device 2.

The dummy area 30 includes one or a plurality of dummy cells 31. The dummy cell 31 may be arranged on the same matrix as that of the memory cell 11. The dummy cell 31 includes a circuit configuration analogous to that of the memory cell 11, but is insulated from the memory cell 11 and each unit of the peripheral circuit 20.

1.1.2. Configuration of a Memory Cell and a Dummy Cell

Next, the configuration of a memory cell and a dummy cell of a magnetic storage device according to the first embodiment will be described using FIG. 3. In the description that follows, it is assumed that the plane parallel to the surface of the wafer 1 is the xy plane and the axis perpendicular to the xy plane is the z axis. The x axis and the y axis are defined as axes orthogonal to each other in the xy plane. FIG. 3 is a schematic view showing the circuit configuration of the memory cell 11 and the dummy cell 31 of the magnetic storage device 2 according to the first embodiment; FIG. 3(a) is a sectional view when the memory cell 11 and the dummy cell 31 adjacent to each other in the x direction are cut by the xz plane. FIG. 3(b) is a sectional view when the memory cell 11 shown in FIG. 3(a) is cut by the yz plane. As shown in FIG. 3, the memory cell 11 and the dummy cell 31 are disposed on a semiconductor substrate 40. The semiconductor substrate 40 is a portion of the wafer 1 that is cut out.

The memory cell 11 includes a magnetoresistive effect element 15, a contact 16, and a select transistor 17. The magnetoresistive effect element 15 and the select transistor 17 are connected in series via the contact 16.

The magnetoresistive effect element 15 is disposed above the semiconductor substrate 40 and includes a stacked film. The magnetoresistive effect element 15 can be switched between a low-resistance state in which the resistance value is low and a high-resistance state in which the resistance value is high by passing a current in a direction perpendicular to the film surface. The magnetoresistive effect element 15 can write data based on changes of the resistance state thereof and functions as a memory element capable of holding data that has been written in a nonvolatile fashion and also reading data. The top surface of the magnetoresistive effect element 15 is connected to the bit line 13 via a bit line contact 13c. The bit line 13 extends toward, for example, the y direction and is connected in common to the magnetoresistive effect elements 15 of other memory cells 11 arranged along the y direction.

The select transistor 17 is disposed as a switch to control the supply and stop of a current when data is written into or read from the magnetoresistive effect element 15. The select transistor 17 includes the word line 12 and a pair of a diffusion area 18a and a diffusion area 18b. The word line 12 functions as a gate of the select transistor 17 and is disposed above the top surface of the semiconductor substrate 40 via a gate dielectric film 19. The word line 12 extends toward, for example, the x direction and is connected in common to the gates of the select transistors 17 of the other memory cells 11 arranged along the x direction. The diffusion area 18a and the diffusion area 18b function as a source or a drain.

The source line 14 extends toward, for example, the y direction and is connected in common to the select transistors 17 of the other memory cells 11 arranged along the y direction via a source line contact 14c. The source line 14 is positioned, for example, above the bit line 13. The bit line 13 and the source line 14 are arranged by avoiding physical and electric interference.

The contact 16 is a conductive layer disposed in contact with the top surface of the semiconductor substrate 40 and has a shape that does not extend linearly in a direction substantially perpendicular to the top surface of the semiconductor substrate 40. More specifically, the contact 16 is configured as described below. That is, the contact 16 includes portions 16a, 16b, 16c. The portions 16a, 16b, 16c are stacked on the semiconductor substrate 40 in this order. The portions 16a, 16b, 16c do not have substantially the same or analogous shapes to each other and at least one of the portions 16a, 16b, 16c extends in the x direction or the y direction. More specifically, in the example of FIG. 3, the portion 16a is connected to the diffusion area 18a and the bottom surface of the portion 16b and has substantially the same or analogous shape to that of the diffusion area 18a in the xy plane. The portion 16c is connected to the top surface of the portion 16b and the bottom surface of the magnetoresistive effect element 15. The portion 16c has a linear shape extending in the y direction in the xy plane. In the description that follows, the portion 16c of the contact 16 will he called a "lower electrode 16c".

An insulating layer 35 is disposed in an area along the z axis from the magnetoresistive effect element 15 of each layer between the magnetoresistive effect element 15 and the semiconductor substrate 40 excluding an area where the lower electrode 16c is disposed. The insulating layer 35 includes a plurality of stacked insulating layers and includes dielectric films 42, 43 described below. The insulating layer 35 includes, for example, silicon oxide and silicon nitride. The thickness of the insulating layer 35 disposed between the magnetoresistive effect element 15 and the semiconductor substrate 40, that is, the lower end of the lower electrode 16c and the semiconductor substrate 40 has a first distance d1. In other words, the first distance d1 is the shortest distance from the lower electrode 16c to the semiconductor substrate 40.

The dummy cell 31 includes a dummy magnetoresistive effect element 32 and a dummy contact 33.

The dummy magnetoresistive effect element 32 is disposed above the top surface of the semiconductor substrate 40 and disposed in the same layer as the magnetoresistive effect element 15. The dummy magnetoresistive effect element 32 includes a film similar to that included in the magnetoresistive effect element 15. More specifically, the dummy magnetoresistive effect element 32 and the magnetoresistive effect element 15 include the same material in the same layer. Accordingly, the dummy magnetoresistive effect element 32 has a function, like the magnetoresistive effect element 15, as a memory element. However, the dummy magnetoresistive effect element 32 is connected to none of circuits inside the magnetic storage device 2 and floats electrically. Thus, the other end of the dummy magnetoresistive effect element 32 is insulated by an insulating layer and thus, the dummy magnetoresistive effect element 32 does not function as a memory element.

The dummy contact 33 includes a conductive layer connected to the top surface of the semiconductor substrate 40 and the bottom surface of the dummy magnetoresistive effect element 32. The dummy contact 33 is disposed in the same layer as the contact 16 and has the same height as that of the contact 16 in the z direction. The dummy contact 33 extends along the z direction. That is, the dummy contact 33 includes portions 33a, 33b, and 33c. The portions 33a, 33b, 33c are stacked on the semiconductor substrate 40 in this order. The portions 33a, 33b, and 33c have substantially the same, similar, or analogous shapes to each other and, in contrast to the contact 16, only one of the portions 33a, 33b, and 33c has a linear shape extending in the x direction or the y direction. The portions 33a, 33b, and 33c include the same materials as those of the portions 16a, 16b, and 16c respectively.

The dummy contact 33 has a plane shape substantially the same, similar, or analogous to that of, for example, the dummy magnetoresistive effect element 32.

The portion 33c of the dummy contact 33 disposed in a position closest to the magnetoresistive effect element 15 is disposed a second distance d2 away from the lower electrode 16c of the contact 16. The first distance d1 and the second distance d2 are set according to the relational expression shown below:

$$d2/d1 \leq TC\_MTJ/TC\_IL \tag{1}$$

where a first thermal conductivity TC_MTJ is a thermal conductivity of the magnetoresistive effect element 15 and the dummy magnetoresistive effect element 32 and a second thermal conductivity TC_IL is a thermal conductivity of an insulating layer disposed between the lower electrode 16c of the contact 16 and the semiconductor substrate 40. The first thermal conductivity TC_MTJ is determined by the thermal conductivity of, among materials included in the magnetoresistive effect element 15 and the dummy magnetoresistive effect element 32, the material of the largest thermal conductivity.

STI (Shallow Trench Isolation) 41 is disposed on the surface of the semiconductor substrate 40. The STI 41 insulates an area to which the dummy contact 33 of the semiconductor substrate 40 is electrically connected from other areas of the semiconductor substrate 40. For example, the select transistor 17 is insulated by the STI 41 from the area to which the dummy contact 33 is electrically connected. That is, the dummy cell 31 is insulated from the memory cell 11. In FIG. 3, the dummy magnetoresistive effect element 32 is disposed on the top surface of the dummy contact 33, but the present embodiment is not limited to such an example and the dummy magnetoresistive effect element 32 may be insulated from the dummy contact 33.

The insulating layer 35 is disposed in an area where none of the contact 16, the dummy contact 33, the magnetoresistive effect element 15, the dummy magnetoresistive effect element 32, and other wirings and contacts (the bit line 13, the source line 14 and the like) is disposed above the semiconductor substrate 40. The insulating layer 35 covers the dummy magnetoresistive effect element 32 and if the dummy magnetoresistive effect element 32 is not disposed, the insulating layer 35 covers the dummy contact 33. Further, an area to which the dummy contact 33 of the semiconductor substrate 40 is connected is insulated from other areas of the semiconductor substrate 40. Therefore, the dummy contact 33 floats electrically.

1.1.3. Configuration of a Magnetoresistive Effect Element

Figures 4, 5:
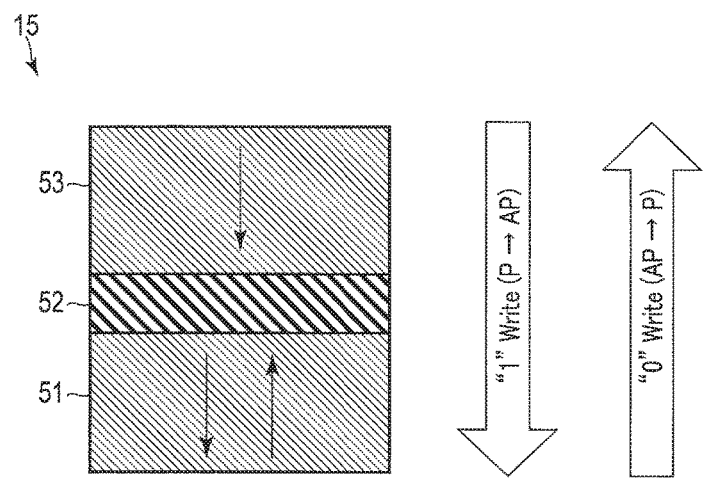
FIG. 4 is a sectional view showing the configuration of a magnetoresistive effect element of the magnetic storage device according to the first embodiment.
FIG. 5 is a table showing characteristics of materials used for the magnetic storage device according to the first embodiment.

Next, the configuration of a magnetoresistive effect element of a magnetic storage device according to the first embodiment will be described using FIG. 4. FIG. 4 is a schematic view showing the configuration of the magnetoresistive effect element 15 and the dummy magnetoresistive effect element 32 of the magnetic storage device 2 according to the first embodiment. As shown in FIG. 4, the magnetoresistive effect element 15 and the dummy magnetoresistive effect element 32 include a storage layer 51 as a first ferromagnetic layer, a tunnel barrier layer 52 as a nonmagnetic layer, and a reference layer 53 as a second ferromagnetic layer. The magnetoresistive effect element 15 and the dummy magnetoresistive effect element 32 have the storage layer 51, and the tunnel barrier layer 52, and the reference layer 53 stacked in this order from the side of the semiconductor substrate 40 to constitute a magnetic tunnel junction (MTJ). The magnetoresistive effect element 15 and the dummy magnetoresistive effect element 32 are perpendicular magnetization type MTJ elements in which the magnetization orientation of each of the storage layer 51 and the reference layer 53 is directed in a direction perpendicular to the film surface.

The storage layer 51 is a ferromagnetic layer having an easy axis of magnetization in a direction perpendicular to the film surface. The storage layer 51 has a magnetization orientation toward a direction of the side of the semiconductor substrate 40 or the side of the reference layer 53. The magnetization orientation of the storage layer 51 is set so as to be inverted more easily than the reference layer 53. The tunnel barrier layer 52 is a nonmagnetic dielectric film and includes, for example, magnesium oxide (MgO). The reference layer 53 is a ferromagnetic layer having an easy axis of magnetization in a direction perpendicular to the film surface. The magnetization orientation of the reference layer 53 is fixed. "The magnetization orientation is fixed" means that the magnetization orientation is not changed by a current large enough so that the magnetization orientation of the storage layer 51 can be inverted.

In the first embodiment, the spin injection writing method by which a write current is passed directly into the magnetoresistive effect element 15 and the magnetization orientation of the storage layer 51 is controlled by the write current is adopted. The magnetoresistive effect element 15 can take the low-resistance state and the high-resistance state depending on whether the relative relation of the magnetization orientation of the storage layer 51 and the reference layer 53 is parallel or antiparallel.

If a write current from the storage layer 51 to the reference layer 53 is passed to the magnetoresistive effect element 15, the relative relation of the magnetization orientation of the storage layer 51 and the reference layer 53 becomes parallel. In the parallel state, the resistance value of the magnetoresistive effect element 15 is the lowest and the magnetoresistive effect element 15 is set to the low-resistance state. This low-resistance state is defined as, for example, data "0".

If a write current from the reference layer 53 to the storage layer 51 is passed to the magnetoresistive effect element 15, the relative relation of the magnetization orientation of the storage layer 51 and the reference layer 53 becomes antiparallel. In the antiparallel state, the resistance value of the magnetoresistive effect element 15 is the highest and the magnetoresistive effect element 15 is set to the high-resistance state. This high-resistance state is defined as, for example, data "1".

1.1.4. Thermal Conductivity of a Magnetic Storage Device

Next, ease with which heat is transferred of the magnetic storage device 2 according to the first embodiment will be described using FIG. 5. FIG. 5 is a table showing characteristics of materials used for the magnetic storage device 2 according to the first embodiment.

As shown in FIG. 5, silicon oxide (SiO2) and silicon nitride (SiN) has a small value of thermal conductivity and a large value of heat capacity. Silicon oxide and silicon nitride are used for, as described above, the insulating layer 35. On the other hand, silicon (Si), hafnium (Hf), titanium nitride (TiN), tantalum (Ta), iron (Fe), copper (Cu) and the like have a large value of thermal conductivity and a small value of heat capacity. Silicon is used for, as described above, the wafer 1 (semiconductor substrate 40). Hafnium, tantalum, and iron are used for, for example, the conductive layer in the magnetic storage device 2 and, for example, a magnetoresistive effect element layer 60. The magnetoresistive effect element layer 60 is a layer that becomes the magnetoresistive effect element 15 and the dummy magnetoresistive effect element 32 by patterning and details thereof will be described below. Titanium nitride and copper are used for, for example, the contact 16 and the dummy contact 33. By using materials as exemplified in FIG. 5, the semiconductor substrate 40, the conductive layer, and the magnetoresistive effect element layer 60 are more likely to transfer heat and rise in temperature than the insulating layer 35.

As described above, the magnetoresistive effect element 15 of the magnetic storage device 2 according to the first embodiment is connected to the semiconductor substrate 40 via the contact 16 having no linear shape in the z direction. On the other hand, the dummy magnetoresistive effect element 32 is connected to the semiconductor substrate 40 via the dummy contact 33 having a linear shape in the z direction. Thus, when the semiconductor substrate 40 is heated, heat from the semiconductor substrate 40 is more likely to be transferred to the dummy magnetoresistive effect element 32 than the magnetoresistive effect element 15 and also the temperature of the dummy magnetoresistive effect element 32 rises more quickly. Further, by setting the first distance d1 and the second distance d2 based on, for example, the relational expression (1), heat is efficiently transferred to the magnetoresistive effect element 15 during manufacturing processes described below.

1.2 Manufacturing Method

Next, the manufacturing method of magnetic storage device according to the first embodiment will be described using FIGS. 6 to 12. FIGS. 6(a) to 12(a) are sectional views of a scribe line area 3A and a cell array area 10A of the magnetic storage device 2 according to the first embodiment in the xz plane. The scribe line area 3A is an area where the scribe line 3 is formed and the cell array area 10A is an area where the memory cell 11 and the dummy cell 31 adjacent to each other in the x direction are formed. FIGS. 6(b) to 12(b) are top views viewing the scribe line area 3A and the cell array area 10A downward from above shown in FIGS. 6(a) to 12(a). Also, FIGS. 6(a) to 12 (a) shows cross sections along a VIA-VIA line, a VIIA-VIIA line, a VIIIA-VIIIA line, a IXA-IXA line, a XA-XA line, a XIA-XIA line, and a XIIA-XIIA line respectively.

In FIGS. 6 to 12, as an example, the two dummy cells 31, the dummy cell 31 disposed in the scribe line area 3A and the dummy cell 31 disposed in the cell array area 10A, and the one memory cell 11 disposed in the cell array area 10A are shown by being arranged in this order in the x direction. Also in FIGS. 6 to 12, of the memory cell 11, the magnetoresistive effect element 15, the contact 16, and a diffusion area 18 (18a or 18b) connected to the contact 16 of the select transistor 17 are shown for the sake of simplicity.

First, an oxide film is deposited all over the semiconductor substrate 40 and then, a nitride film is deposited on the top surface of the oxide film. The oxide film is, for example, a film of silicon oxide and the nitride film is, for example, a film of silicon nitride. A film is disposed by a lithography process on the nitride film. The film has a hole in an area where the STI 41 is planned to be disposed. The film includes, for example, TEOS (Tetra Ethyl Ortho Silicate). The hole of the film is transferred to the nitride film and the oxide film by RIE (Reactive Ion Etching) in which the film is used as a mask. Subsequently, a trench is disposed in the semiconductor substrate 40 by RIE in which the nitride film and the oxide film are used as masks. The trench has a shape along the shape of the hole of the film along the xy plane and has, for example, a circular hollow shape.

As shown in FIG. 6, the dielectric film (STI) 41 is deposited on the surface of the trench. The dielectric film 41 buries, for example, the trench. Subsequently, the diffusion area 18 is disposed by ion implantation for the functioning as a source or drain of the select transistor 17 into the semiconductor substrate 40. The diffusion area 18 is disposed in an area shifted in the y direction with respect to an area surrounded by the STI 41.

Subsequently, a dielectric film and a conductive film are deposited all over the surface of the structure obtained by the processes heretofore. The dielectric film and the conductive film are removed by RIE while leaving an area planned to dispose the word line 12 of the select transistor 17 (not shown).

Figure 7:
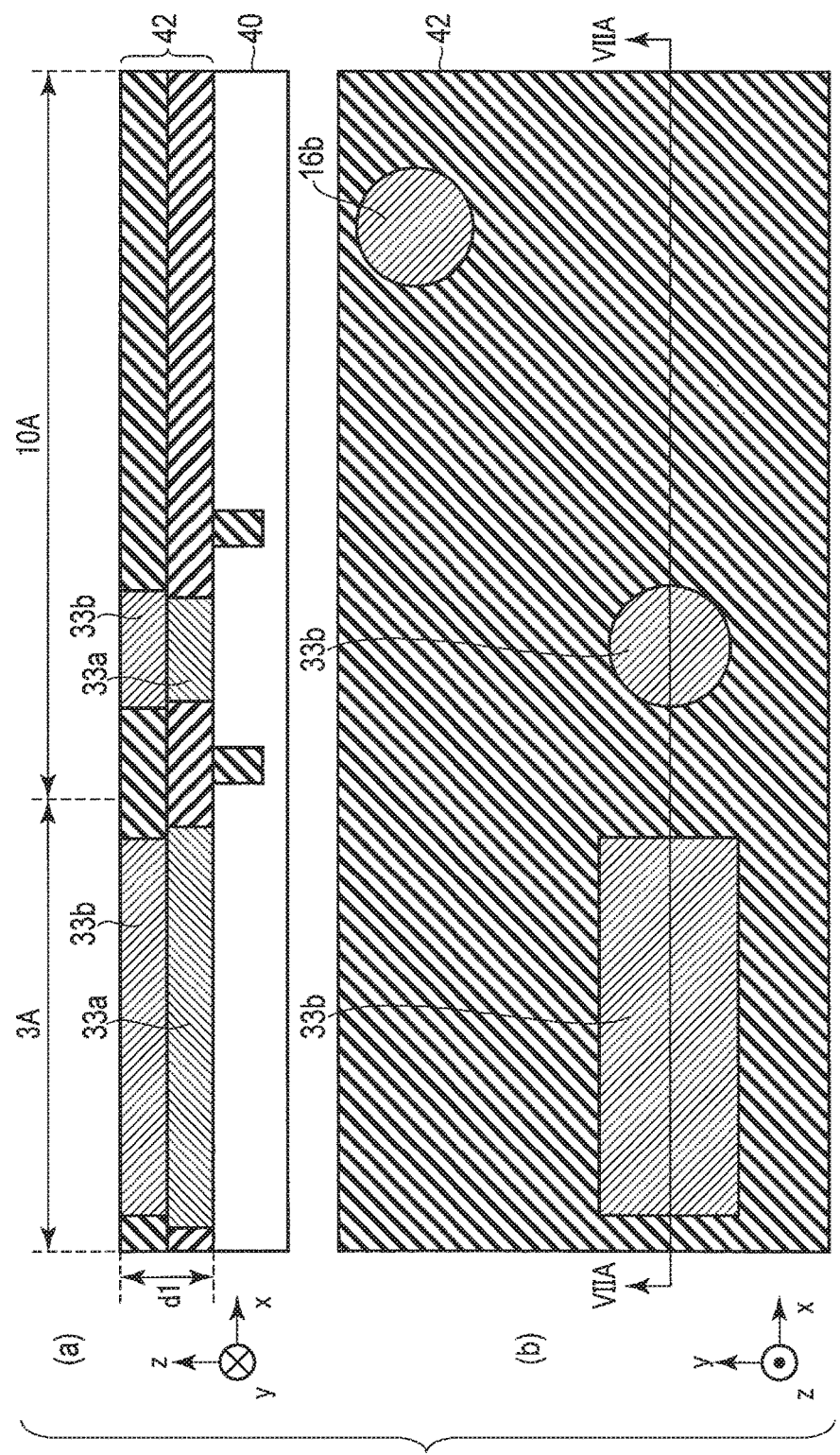
FIG. 7 is a schematic view showing a portion of the manufacturing method of the magnetic storage device according to the first embodiment.

As shown in FIG. 7, the dielectric film 42 of the thickness of the first distance d1 is deposited all over the surface of the structure obtained by the processes heretofore. An area of the dielectric film 42 where the contact 16 or the dummy contact 33 is planned to be disposed is removed by etching based on, for example, RIE to dispose a trench. The diffusion area 18 on the surface of the semiconductor substrate 40 is exposed by etching from the bottom of the trench disposed in an area where the contact 16 is planned to be disposed. Also, an area surrounded by the STI 41 of the surface of the semiconductor substrate 40 is exposed by etching from the bottom of the trench disposed in an area where the dummy contact 33 is planned to be disposed. Incidentally, the bottom of the trench may not be surrounded by the STI 41 on the scribe line 3. Conductive films (the portions 16a, 16b of the contact 16 and the portions 33a, 33b of the dummy contact 33) are deposited in the trench.

Figure 8:
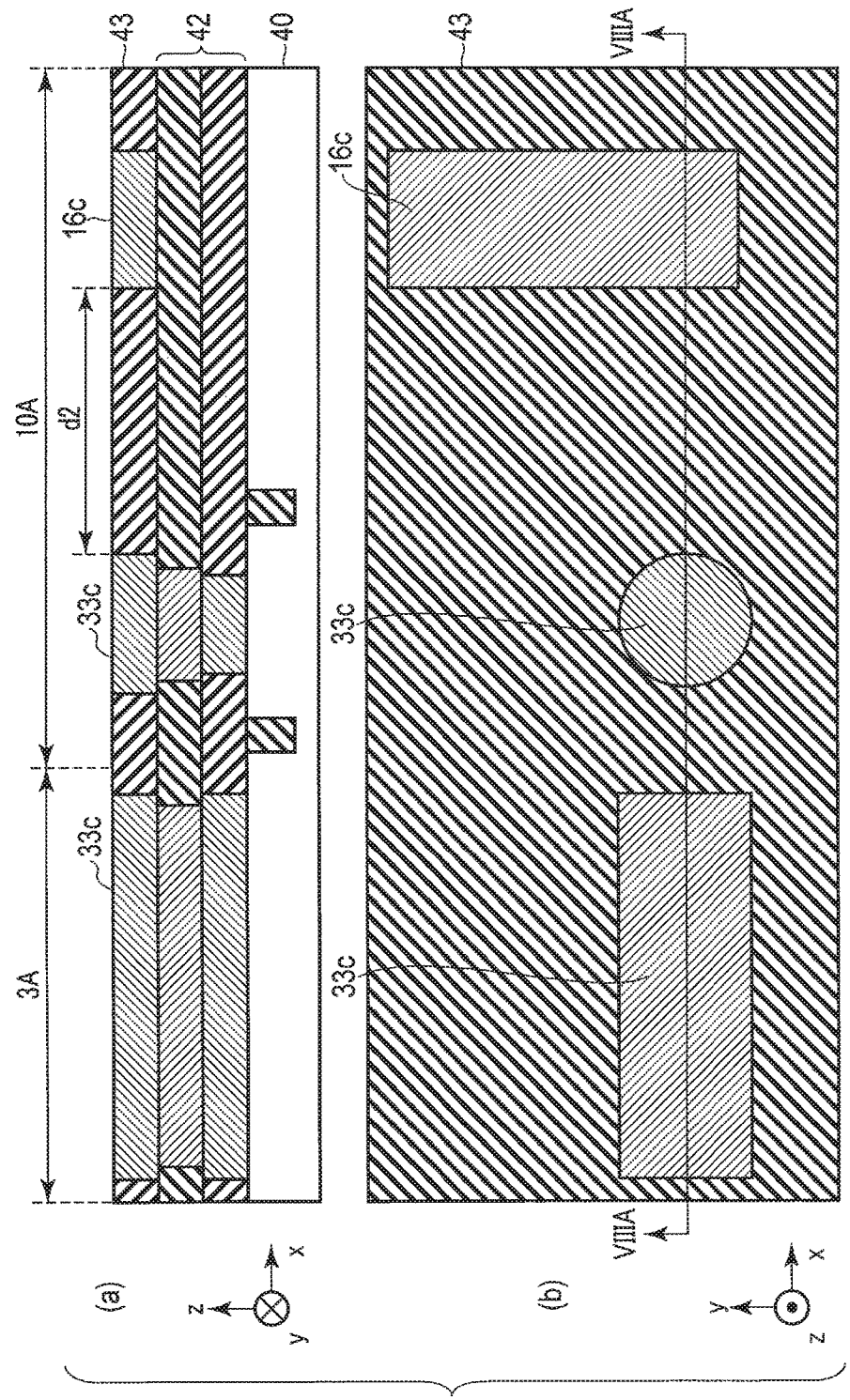
FIG. 8 is a schematic view showing a portion of the manufacturing method of the magnetic storage device according to the first embodiment.

As shown in FIG. 8, the dielectric film 43 is deposited all over the surface of the structure obtained by the processes heretofore. The dielectric film 43 has holes in areas where the lower electrode 16c of the contact 16 and the portion 33c of the dummy contact 33 are planned to be disposed. Conductive films (the lower electrode 16c of the contact 16 and the portion 33c of the dummy contact 33) are deposited in each hole. The hole of the area where the lower electrode 16c of the contact 16 is planned to be disposed has, for example, a shape extending in the y direction from an area in contact with the contact 16 extending in the z direction from the top surface of the semiconductor substrate 40 (area above the contact 16) to an area in contact with an area where the magnetoresistive effect element 15 is planned to be disposed. Also, as described above, the lower electrode 16c of the contact 16 and the portion 33c of the dummy contact 33 closest to the lower electrode 16c are disposed the second distance d2 satisfying the relational expression (1) for the first distance d1 away from each other.

Figure 9:
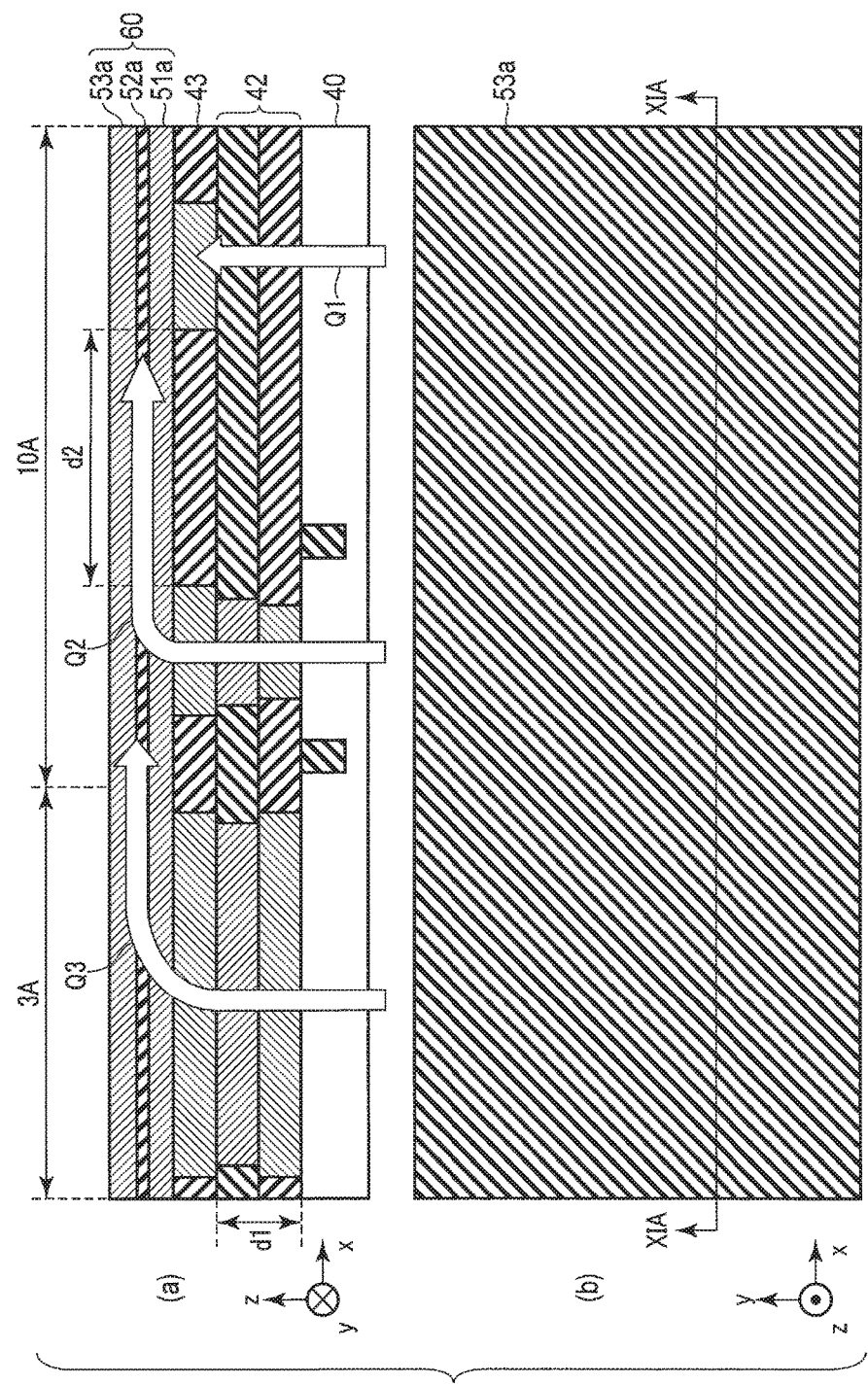
FIG. 9 is a schematic view showing a portion of the manufacturing method of the magnetic storage device according to the first embodiment.

As shown in FIG. 9, the magnetoresistive effect element layer 60 is deposited all over the surface of the structure obtained by the processes heretofore. The magnetoresistive effect element layer 60 includes a ferromagnetic film 51a, a nonmagnetic film 52a, and a ferromagnetic film 53a. Thus, the deposition of the magnetoresistive effect element layer 60 includes the deposition of the ferromagnetic film 51a, the deposition of the nonmagnetic film 52a on the top surface of the ferromagnetic film 51a, and the deposition of the ferromagnetic film 53a on the top surface of the nonmagnetic film 52a. The ferromagnetic film 51a, the nonmagnetic film 52a, and the ferromagnetic film 53a are layers planned to function as the storage layer 51, the tunnel barrier layer 52, and the reference layer 53 respectively by etching performed later. Subsequently, the wafer 1 is moved onto a substrate heating stage (not shown). The substrate heating stage adds heat to the wafer 1 from the bottom surface of the semiconductor substrate 40 in contact with the substrate heating stage. Heat is transferred to the ferromagnetic film 51a, the nonmagnetic film 52a, and the ferromagnetic film 53a from the semiconductor substrate 40 via each deposition layer. Magnetization of the ferromagnetic film 51a, the nonmagnetic film 52a, and the ferromagnetic film 53a is stabilized with improved crystallinity by being placed under conditions of the predetermined heating time and the predetermined temperature by heat.

In FIG. 9, three paths Q1, Q2, Q3 are shown as paths of heat on which heat is transferred to an area where the magnetoresistive effect element 15 is planned to be disposed of the magnetoresistive effect element layer 60. The path Q1 is a path on which heat is transferred from the semiconductor substrate 40 to the area where the magnetoresistive effect element 15 is planned to be disposed via the dielectric film 42 and the lower electrode 16c of the contact 16. The path Q2 is a path on which heat is transferred from the semiconductor substrate 40 to the magnetoresistive effect element layer 60 via the dummy contact 33 closest to the contact 16 and then, heat is transferred up to the area where the magnetoresistive effect element 15 is planned to be disposed through the magnetoresistive effect element layer 60. The path Q3 is the same as the path Q2 except that the dummy contact 33 is not closest to the contact 16.

The area where the magnetoresistive effect element 15 is planned to he disposed of the magnetoresistive effect element layer 60 is heated by, for example, heat conducted on the paths Q1, Q2, and Q3. The paths Q2, Q3 have the dummy contact 33 and the magnetoresistive effect element layer 60 as the main path of heat and thus, heat is conducted thereon more quickly than on the path Q1 for which the dielectric film 42 is the main path. Particularly, the path Q2 is set such that the second distance d2 satisfies the relational expression (1) for the first distance d1. Therefore, heat transferred on the path Q2 can heat the area where the magnetoresistive effect element 15 is planned to be disposed more quickly than heat transferred on the path Q1.

Figure 10:
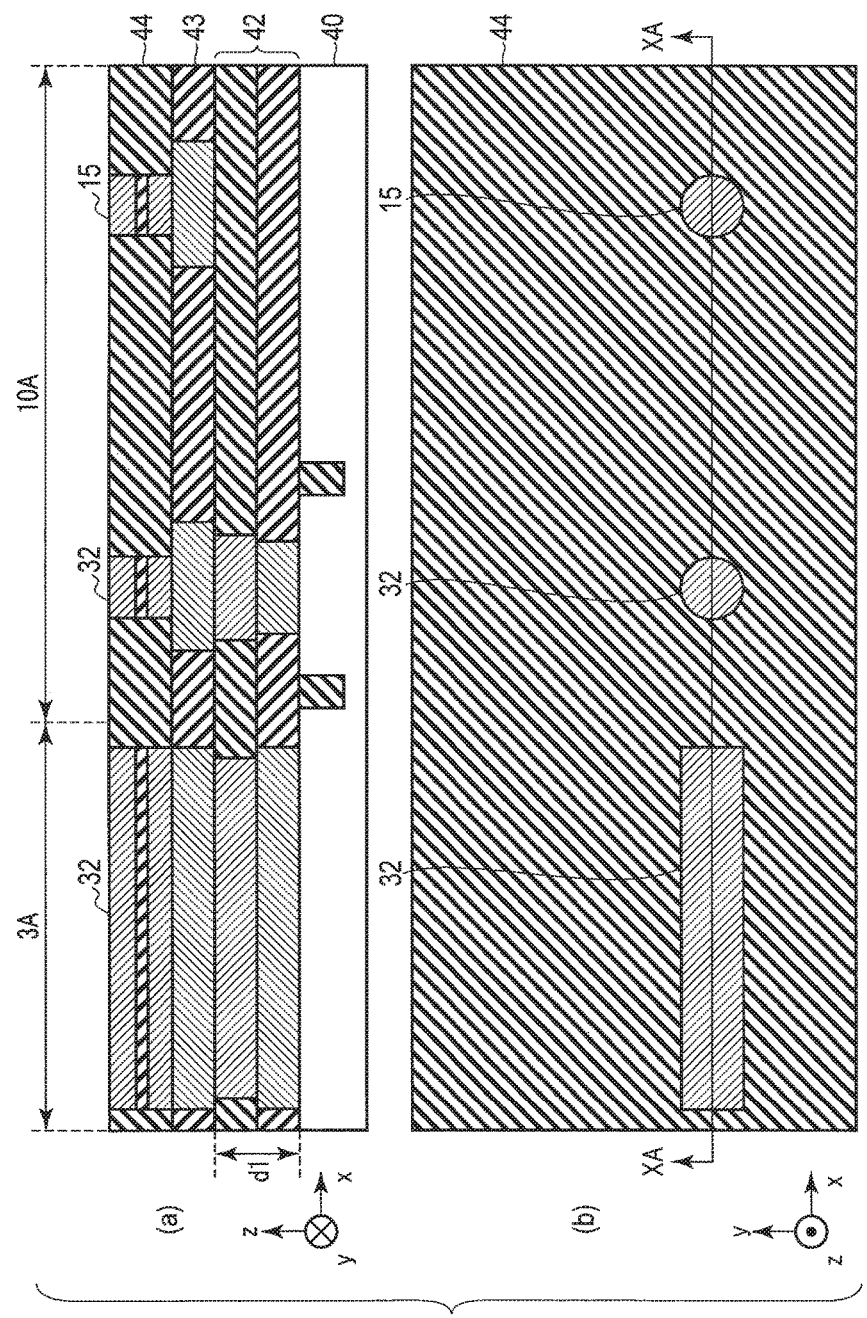
FIG. 10 is a schematic view showing a portion of the manufacturing method of the magnetic storage device according to the first embodiment.

As shown in FIG. 10, the ferromagnetic film 51a, the nonmagnetic film 52a, and the ferromagnetic film 53a are removed by etching while leaving areas where the magnetoresistive effect element 15 and the dummy magnetoresistive effect element 32 are planned to be disposed. As a result, the magnetoresistive effect element 15 and the dummy magnetoresistive effect element 32 are disposed. A dielectric film 44 is deposited in areas from which the ferromagnetic film 51a, the nonmagnetic film 52a, and the ferromagnetic film 53a have been removed to dispose the magnetoresistive effect element 15 and the dummy magnetoresistive effect element 32.

Figure 11:
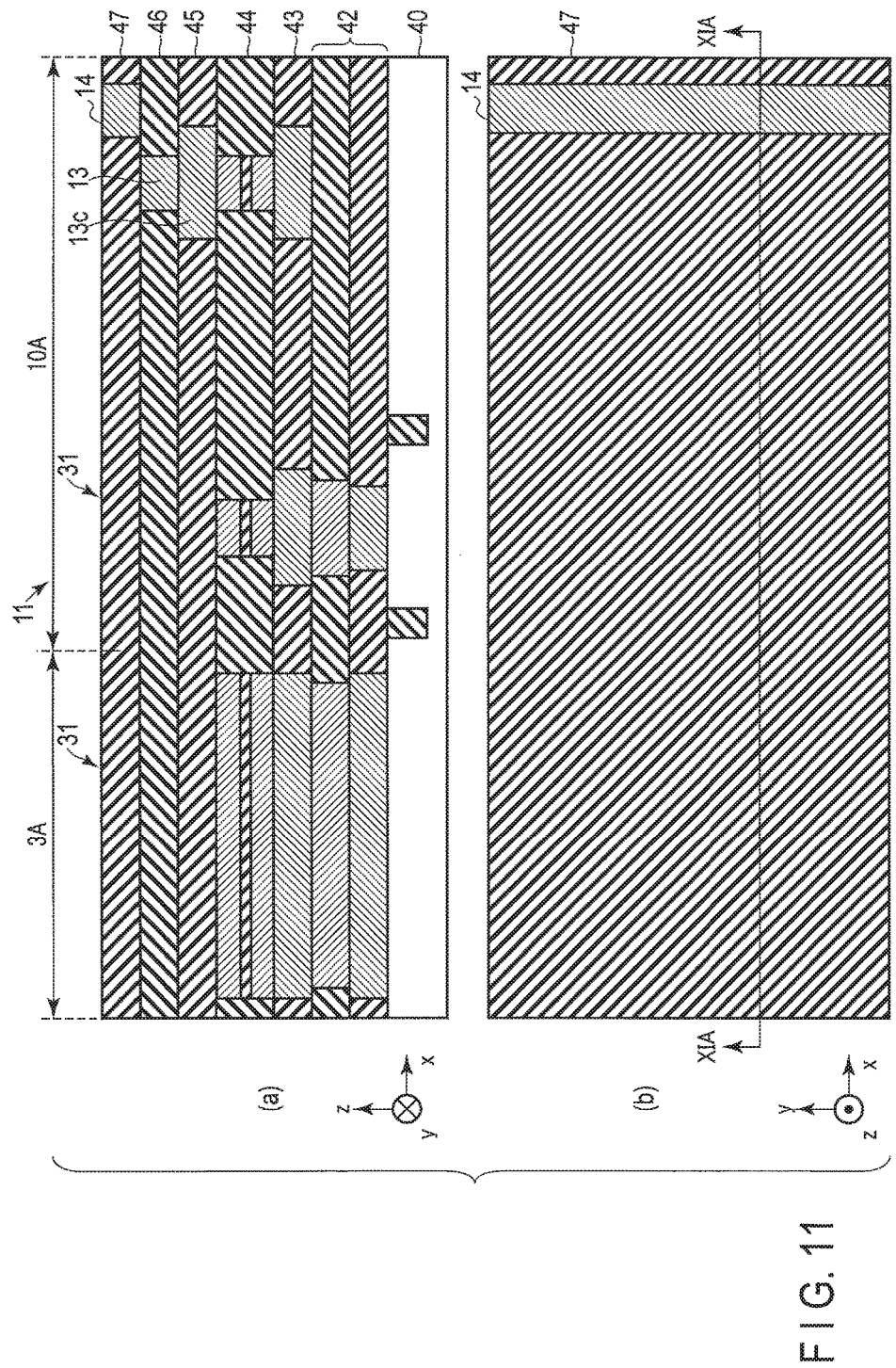
FIG. 11 is a schematic view showing a portion of the manufacturing method of the magnetic storage device according to the first embodiment.

As shown in FIG. 11, a dielectric film 45 is deposited all over the surface of the structure obtained by the processes heretofore. The dielectric film 45 is removed from an area where the bit line contact 13c is planned to be disposed. A conductive film is deposited in the area where the bit line contact 13c is planned to be disposed. Subsequently, a dielectric film 46 is deposited all over the surface of the structure obtained by the processes heretofore. The dielectric film 46 is removed by etching based on, for example, RIE from an area where the bit line 13 is disposed to deposit the conductive film (bit line) 13. The dielectric films 42 to 46 are removed by etching based on, for example, RIE from an area where the source line contact 14c is disposed to dispose a trench. The diffusion area 18 on the surface of the semiconductor substrate 40 is exposed by etching from the bottom of the trench. A conductive film (source line contact 14c) is deposited in the trench. Subsequently, the conductive film (source line) 14 and a dielectric film 47 are disposed.

Figure 12:
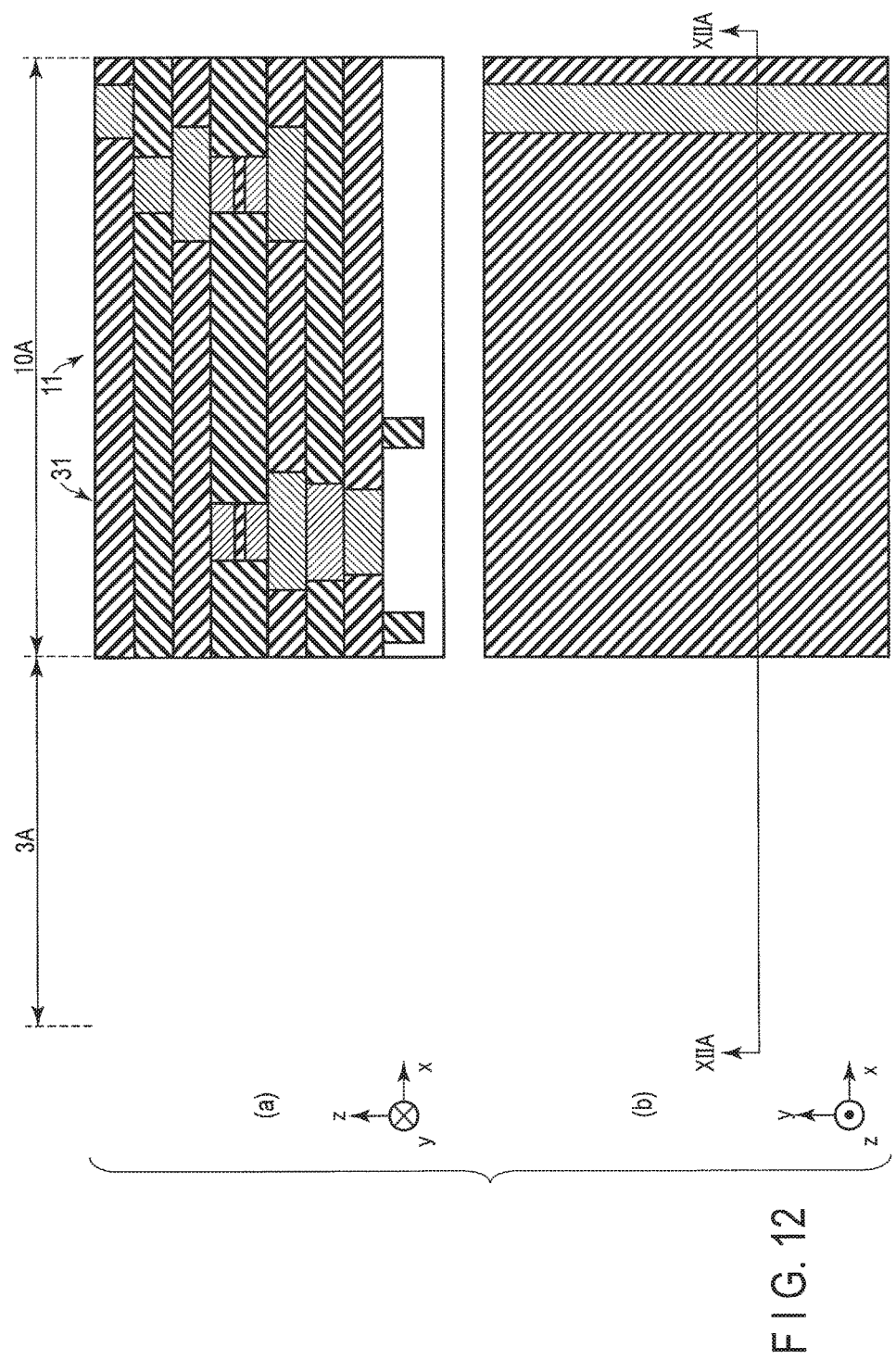
FIG. 12 is a schematic view showing a portion of the manufacturing method of the magnetic storage device according to the first embodiment.

As shown in FIG. 12, the wafer 1 is cut on the scribe line 3 to obtain a structure of the magnetic storage device 2 having the dummy cell 31 and the memory cell 11.

1.3 Effects According to the Present Embodiment

In a film forming process of the magnetoresistive effect element 15, heat treatment is applied to stabilize magnetization by improving crystallinity of the magnetoresistive effect element layer 60. In the heat treatment, heat is transferred to the magnetoresistive effect element layer 60 via a deposited film by applying heat to the semiconductor substrate 40 from the substrate heating stage on which the wafer 1 is placed. However, the contact 16 disposed on the bottom surface of the magnetoresistive effect element layer 60 is not disposed linearly in the z direction. Therefore, there is room for further studies of the magnetoresistive effect element layer 60 regarding the fact that heat is not efficiently conducted during heat treatment.

According to the first embodiment, the dummy contact 33 is included. The dummy contact 33 extends from the top surface of the semiconductor substrate 40 up to the bottom surface of the layer of the magnetoresistive effect element 15 to be insulated from the magnetoresistive effect element 15. The dummy contact 33 includes a conductive material and the conductive material generally has a high thermal conductivity. Thus, heat flowing in from the substrate heating stage is conducted by the dummy contact 33. Accordingly, heat flowing in from the substrate heating stage during heat treatment is conducted to the magnetoresistive effect element layer 60 not only via the contact 16, but also via the dummy contact 33. In addition, the dummy contact 33 linearly extends from the top surface of the semiconductor substrate 40 up to the bottom surface of the same layer as that of the magnetoresistive effect element 15. That is, the dummy contact 33 connects the semiconductor substrate 40 and the magnetoresistive effect element layer 60 by covering the shortest distance. Thus, heat is conducted from the semiconductor substrate 40 to an area where the magnetoresistive effect element 15 is planned to be disposed of the magnetoresistive effect element layer 60 via the dummy contact 33 by covering the shortest distance. Therefore, heat can efficiently be transferred to the area where the magnetoresistive effect element 15 is planned to be disposed of the magnetoresistive effect element layer 60.

Also, according to a first mode of the first embodiment, the ratio of the second distance d2 to the first distance d1 is set so as to be equal to or less than a preset coefficient. Accordingly, the path Q2 of heat can be arranged in a position adjacent to the magnetoresistive effect element 15. Therefore, heat transferred from the dummy cell 31 can be transferred to the magnetoresistive effect element 15 more efficiently.

Also, according to a second mode of the first embodiment, the preset coefficient set so as to be the ratio of thermal conductivities of the path Q1 and the path Q2. Accordingly, heat conducted on the path Q2 is transferred to the magnetoresistive effect element 15 more quickly than heat conducted on the path Q1. More specifically, the contact 16 is configured as described below. That is, heat is also transferred to the magnetoresistive effect element 15 via the path Q1. However, the dielectric film 42 has a small thermal conductivity and the transfer of heat on the path Q1 is less efficient. Thus, by providing the path Q2 and further selecting the first distance d1 and the second distance d2 and materials of the path Q1 and the path Q2 such that the expression (1) is satisfied, the transfer of heat on the path Q2 is more quick than the transfer of heat on the path Q1. In this manner, the transfer of heat on the path Q2 can efficiently be utilized. Therefore, the magnetoresistive effect element 15 can be heated more quickly.

Also, according to a third mode of the first embodiment, the STI 41 is further disposed. Accordingly, the dummy cell 31 is electrically insulated from the memory cell 11 also on the surface of the semiconductor substrate 40. Therefore, an electric influence that can be directed by the dummy cell 31 to the memory cell 11 can be reduced.

Also, according to a fourth mode of the first embodiment, the dummy magnetoresistive effect element 32 disposed in the same layer as the magnetoresistive effect element 15 and insulated from the magnetoresistive effect element 15 may further be included. Accordingly, the dummy magnetoresistive effect element 32 functions as the dummy cell 31. To provide supplementary remarks, if no other magnetoresistive effect element is disposed around the magnetoresistive effect element 15 during etching, etching precision may vary. The dummy magnetoresistive effect element 32 can suppress variations of etching precision that can arise in the magnetoresistive effect element 15 by being arranged around the magnetoresistive effect element 15. Therefore, the magnetoresistive effect element 15 can be formed with more precision.

2. Second Embodiment

Next, a magnetic storage device according the second embodiment will be described. The magnetic storage device according to the second embodiment allows measurements of resistance value characteristics of a magnetoresistive effect element during film formation. Hereinafter, different portions from the first embodiment will be described and the description of similar portions is omitted.

2.1 Configuration

Figure 13:
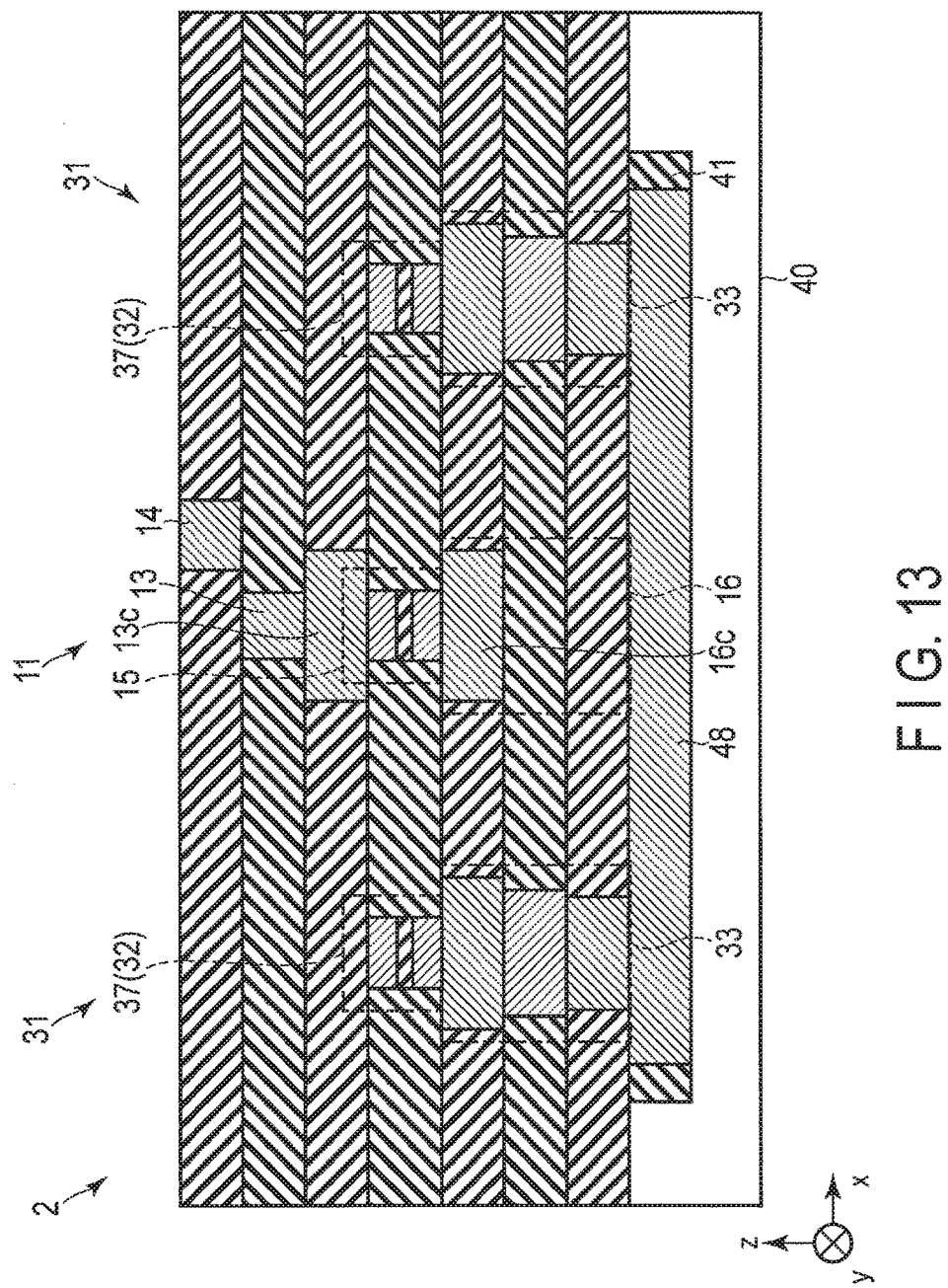
FIG. 13 is a sectional view showing a configuration example of the memory cell and the dummy cell of the magnetic storage device according to a second embodiment.

First, the configuration of a magnetic storage device according to the second embodiment will be described using FIG. 13. FIG. 13 is a schematic view showing the circuit configuration of a memory cell 11 and a dummy cell 31 of a magnetic storage device 2 according to the second embodiment and a sectional view when the memory cell 11 and a plurality of the dummy cells 31 adjacent to each other in the x direction are cut by the xz plane.

As shown in FIG. 13, the magnetic storage device 2 includes the memory cell 11 and the plurality of dummy cells 31 (two dummy cells 31 in FIG. 13). The circuit configuration of the memory cell 11 and the dummy cells 31 is the same as in the first embodiment and thus, the description thereof is omitted. It is also assumed that each of the dummy cells 31 has the same circuit configuration.

The memory cell 11 is disposed between the dummy cells 31 arranged along the x direction. More specifically, a magnetoresistive effect element 15 of the memory cell 11 is disposed on a straight line connecting the top surface of each of dummy contacts 33. Also, an STI 41 and a conductive layer 48 are disposed on the surface of a semiconductor substrate 40.

The conductive layer 48 is insulated from the magnetoresistive effect element 15. The STI 41 surrounds the conductive layer 48. Though not shown in FIG. 13, the STI 41 does not surround an area electrically connected to the memory cell 11 on the surface of the semiconductor substrate 40. That is, the STI 41 insulates the conductive layer 48 from the memory cell 11 on the surface of the semiconductor substrate 40.

A plurality of the dummy contacts 33 electrically connects respective bottom surfaces of a plurality of connection areas 37 disposed in the same layer as the magnetoresistive effect element 15 (hereinafter, simply called "a plurality of connection areas 37") via the conductive layer 48. More specifically, each of the dummy contacts 33 is disposed by being in contact with the top surface of the conductive layer 48. The top surface of each of the dummy contacts 33 extends up to the bottom surface of the same layer as that of the magnetoresistive effect element 15. In contrast to the first embodiment, each of the dummy contacts 33 does not necessarily need to linearly extend in a direction substantially perpendicular to the top surface of the semiconductor substrate 40.

In the example shown in FIG. 13, each of the plurality of connection areas 37 corresponds to an area where a dummy magnetoresistive effect element 32, but the present embodiment is not limited to such an example and the connection area 37 can be disposed in an area insulated from the magnetoresistive effect element 15. The plurality of connection areas 37 is disposed by being separated from each other by a certain distance to measure RA (Resistance Area product) as resistance value characteristics of the magnetoresistive effect element 15 and the MR ratio (Magneto Resistance ratio) by CIPT (Current In Plane Tunneling) with precision. In the description that follows, measuring the resistance value characteristics RA and MR ratio by CIPT will be called simply "CIPT measurements". The distance between the plurality of connection areas 37 corresponds to an inter-terminal distance λ of a probe used for CIPT measurement and is set to, for example, the length of the inter-terminal distance λ or more. The inter-terminal distance λ of a probe is desirably set to a range, for example, longer than 1.5 μm and shorter than 35 μm to make CIPT measurements with precision.

The inter-terminal distance λ of a probe and the resistance value characteristics RA satisfy the relational expression shown below:

$$\lambda = \sqrt{(RA/(R_T + R_B))} \quad (2)$$

where an upper combined electric resistivity $R_T$ is a combined electric resistivity of layers deposited above a tunnel barrier layer 52 when CIPT measurements are made. A lower combined electric resistivity $R_B$ is a combined electric resistivity of layers deposited below the tunnel barrier layer 52 when CIPT measurements are made.

Each of the dummy contacts 33 and the conductive layer 48 has a certain combined electric resistivity. A certain combined electric resistivity held by each of the dummy contacts 33 and the conductive layer 48 is a parameter of the lower combined electric resistivity $R_B$ and a value satisfying the relational expression (2) is set thereto. On the other hand, the lower combined electric resistivity $R_B$ is desirably set to a value smaller than, for example, the value 10 times the upper combined electric resistivity $R_T$ to make CIPT measurements with precision. Thus, a material having an electric resistivity lower than that of each of the dummy contacts 33 is used for the conductive layer 48 to lower the value of the lower combined electric resistivity $R_B$. The conductive layer 48 is disposed by, for example, silicifying the semiconductor substrate 40. The conductive layer 48 may also be disposed by, for example, introducing impurities through ion implantation into the semiconductor substrate 40 or embedding a metal layer of low electric resistivity such as copper (Cu) in the semiconductor substrate 40.

2.2 Manufacturing Method

Next, the manufacturing method of magnetic storage devices according to the second embodiment will be described using FIGS. 14 to 20. FIGS. 14(a) to 20(a) are sectional views of a scribe line area 3A and a cell array area 10A of the magnetic storage device 2 according to the second embodiment in the xz plane. FIGS. 14(b) to 20(b) are top views viewing the scribe line area 3A and the cell array area 10A downward from above shown in FIGS. 14(a) to 20(a). Also, FIGS. 14 (a) to 20 (a) shows cross sections along a XIVA-XIVA line, a XVA-XVA line, a XVIA-XVIA line, a XVIIA-XVIIA line, a XVIIIA-XVIIIA line, a XIXA-XIXA line, and a XXA-XXA line respectively.

In FIGS. 14 to 20, as an example, the dummy cell 31 disposed in the scribe line area 3A and the dummy cell 31 disposed in the cell array area 10A, the memory cell 11, and the dummy cell 31 are shown by being arranged in this order in the x direction. Also in FIGS. 14 to 20, like in FIGS. 6 to 12, of the memory cell 11, the magnetoresistive effect element 15, a contact 16, and a diffusion area 18a connected to the contact 16 of a select transistor 17 are shown for the sake of simplicity.

First, a trench is disposed in an area where the STI 41 of the semiconductor substrate 40 is planned to be disposed. The trench has, for example, a substantially rectangular shape and surrounds an area where the conductive layer 48 is planned to be disposed in the magnetic storage device 2. The trench does not surround an area where a diffusion area 18 is planned to be disposed.

Figure 14:
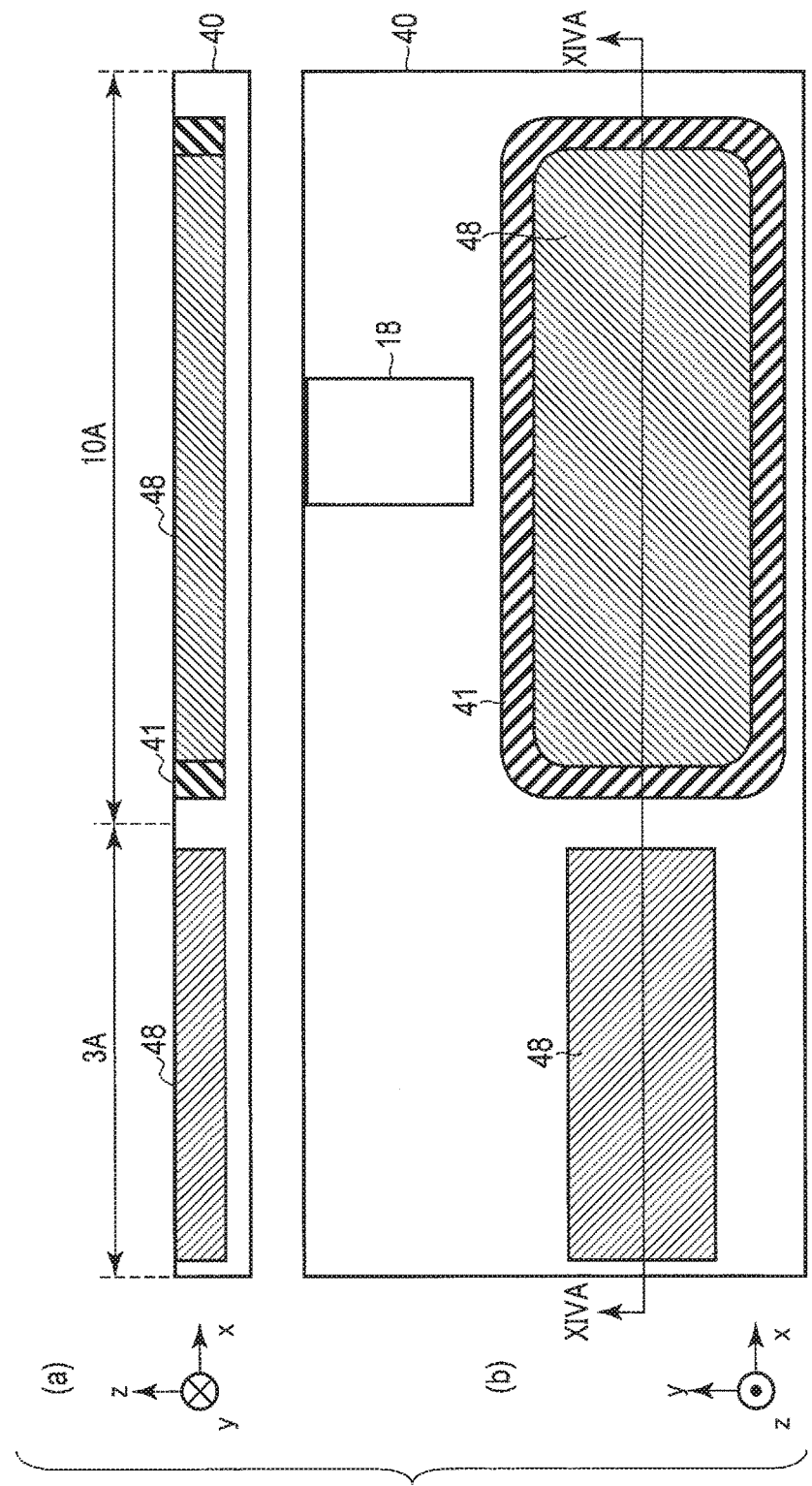
FIG. 14 is a schematic view showing a portion of the manufacturing method of the magnetic storage device according to the second embodiment.

As shown in FIG. 14, the dielectric film (STI) 41 is deposited on the surface of the trench by a process similar to that in FIG. 6. Subsequently, a metal film is deposited on the top surface of the semiconductor substrate 40. The metal film is removed by etching while leaving an area planned to be silicified. The metal film reacts with the surface of the semiconductor substrate 40 by, for example, heat treatment to silicify the surface of the semiconductor substrate 40. The silicified surface of the semiconductor substrate 40 functions as the conductive layer 48. Subsequently, the diffusion area 18 is disposed by ion implantation for the functioning as a source or drain of the select transistor 17 into the semiconductor substrate 40 by a process similar to that in FIG. 6. The diffusion area 18 is disposed in an area shifted in the y direction with respect to an area surrounded by the STI 41.

Subsequently, a dielectric film and a conductive film are deposited all over the surface of the structure obtained by the processes heretofore. The dielectric film and the conductive film are removed by etching while leaving an area where a word line 12 of the select transistor 17 is planned to be disposed (not shown).

As shown in FIG. 15, a dielectric film 42 is deposited and a trench is disposed by etching in an area where the contact 16 and the plurality of dummy contacts 33 are planned to be disposed by a process similar to that in FIG. 7. Incidentally, the conductive layer 48 of the surface of the semiconductor substrate 40 is exposed from the bottom of the trench disposed in an area where the plurality of dummy contacts 33 is planned to be disposed. Conductive films (the portions 16*a*, 16*b* of the contact 16 and the portions 33*a*, 33*b* of the dummy contact 33) are deposited in the trench.

Figure 16:
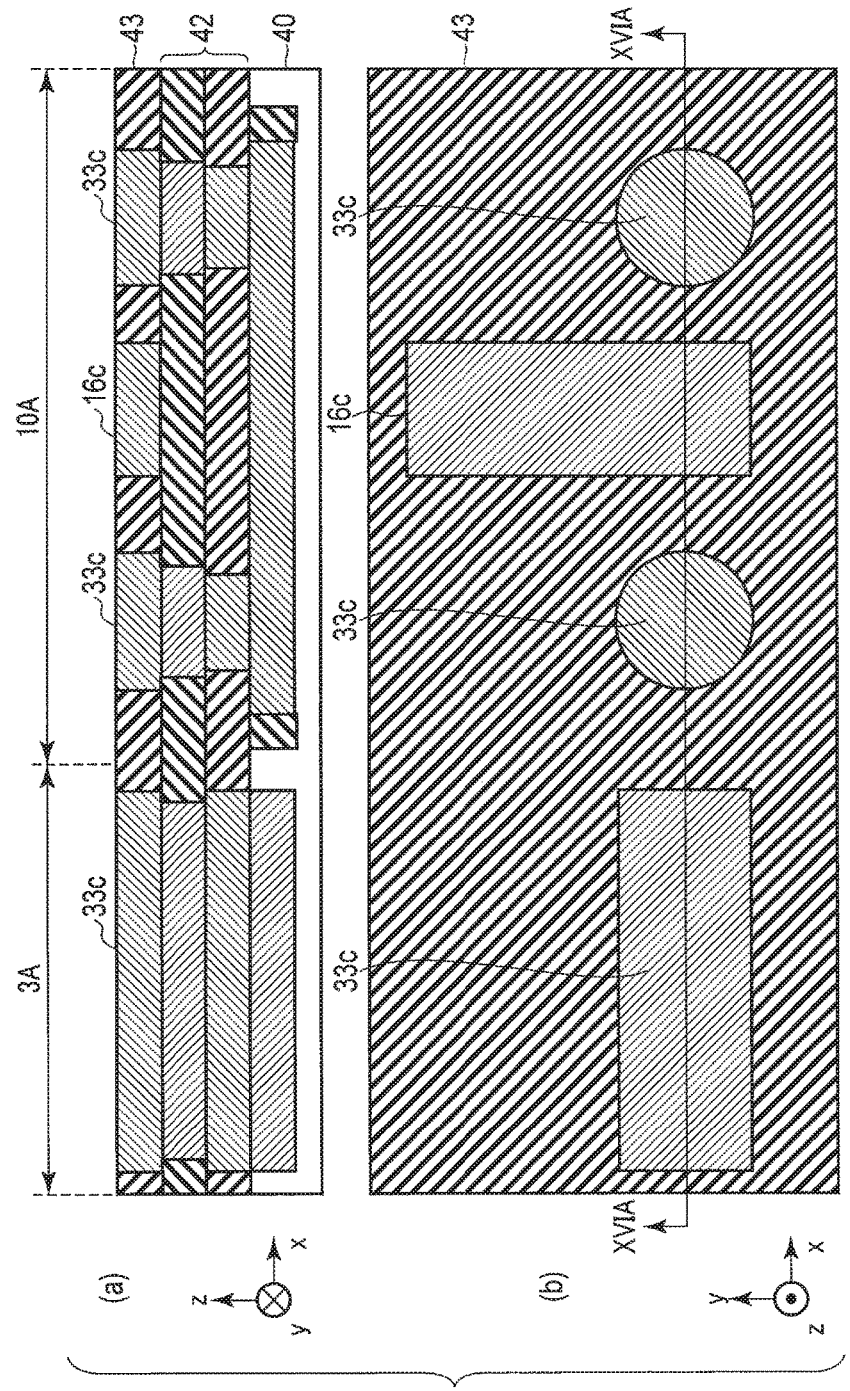
FIG. 16 is a schematic view showing a portion of the manufacturing method of the magnetic storage device according to the second embodiment.

As shown in FIG. 16, a dielectric film 43, a lower electrode 16*c* of the contact 16, portions 33*c* of the plurality of dummy contacts 33 are disposed by a process similar to that in FIG. 8 all over the surface of the structure obtained by the processes heretofore.

Figure 17:
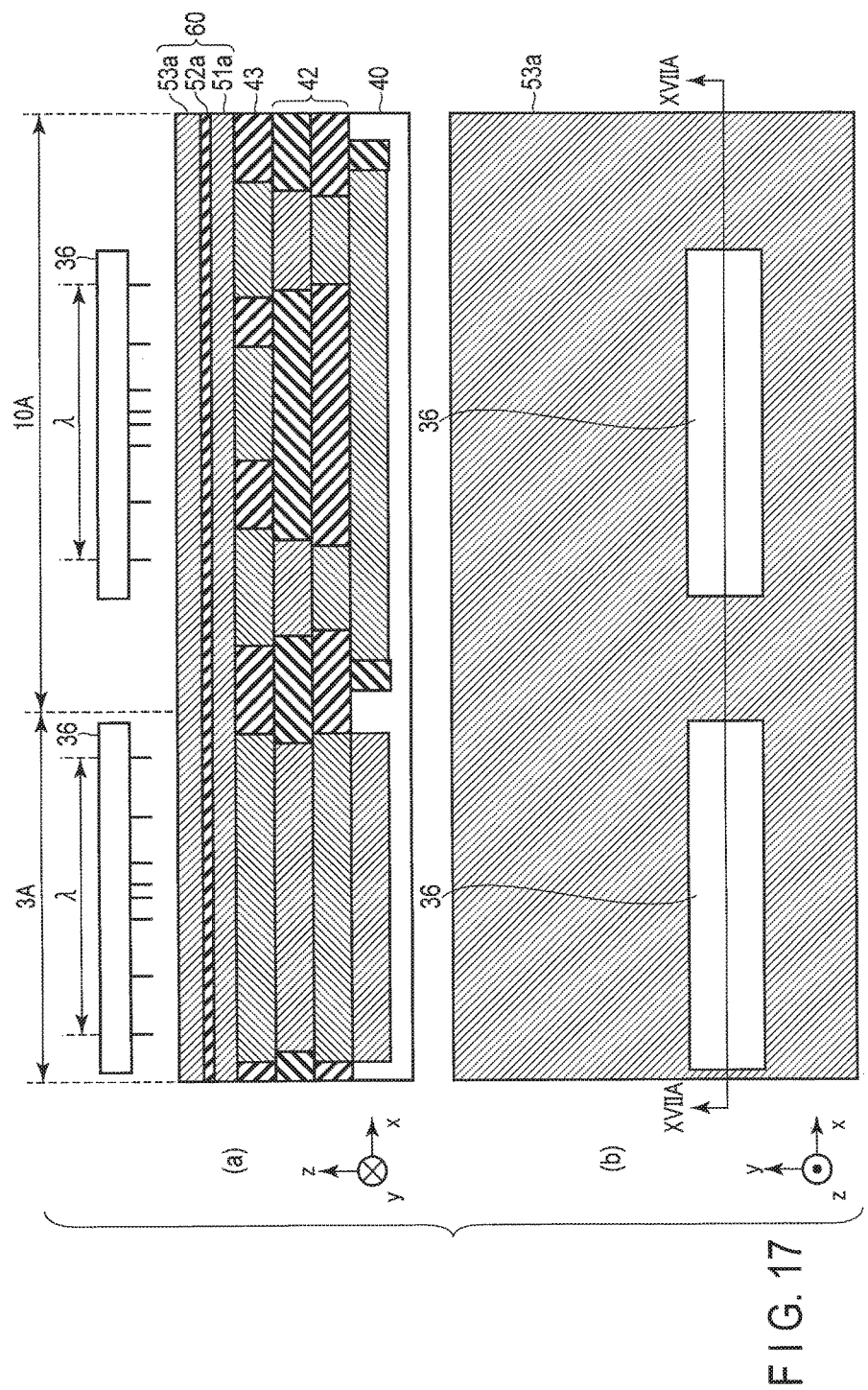
FIG. 17 is a schematic view showing a portion of the manufacturing method of the magnetic storage device according to the second embodiment.

As shown in FIG. 17, a magnetoresistive effect element layer 60 is deposited by a process similar to that in FIG. 9 all over the surface of the structure obtained by the processes heretofore. That is, a ferromagnetic film 51*a*, a nonmagnetic film 52*a*, and a ferromagnetic film 53*a* are stacked in this order. The ferromagnetic film 51*a*, the nonmagnetic film 52*a*, and the ferromagnetic film 53*a* are thermally treated so that magnetization is stabilized. Subsequently, a current is passed from the top surface of the ferromagnetic film 53*a* via a probe 36 to make CIPT measurements. Incidentally, external terminals having the inter-terminal distance λ of terminals of the probe 36 function as terminals that pass a current via layers below the magnetoresistive effect element layer 60. Therefore, external terminals of terminals of the probe 36 are desirably arranged near the plurality of connection areas 37 in contact with the top surface of the dummy contact 33 of the magnetoresistive effect element layer 60.

If it turns out that the resistance value characteristics RA and MR ratio that are desirable are not obtained by CIPT measurements, subsequent manufacturing processes for a wafer 1 may be stopped. In order for the measured resistance value characteristics RA and MR ratio to have desired values, feedback of manufacturing conditions and the like for the magnetic storage device 2 of the wafer 1 whose CIPT measurements have been made may be given to manufacturing conditions of the magnetic storage device 2 of another wafer 1 manufactured later. That is, based on results obtained from CIPT measurements, conditions for various kinds of processing on the other wafer 1 manufactured later are adjusted.

Figure 18:
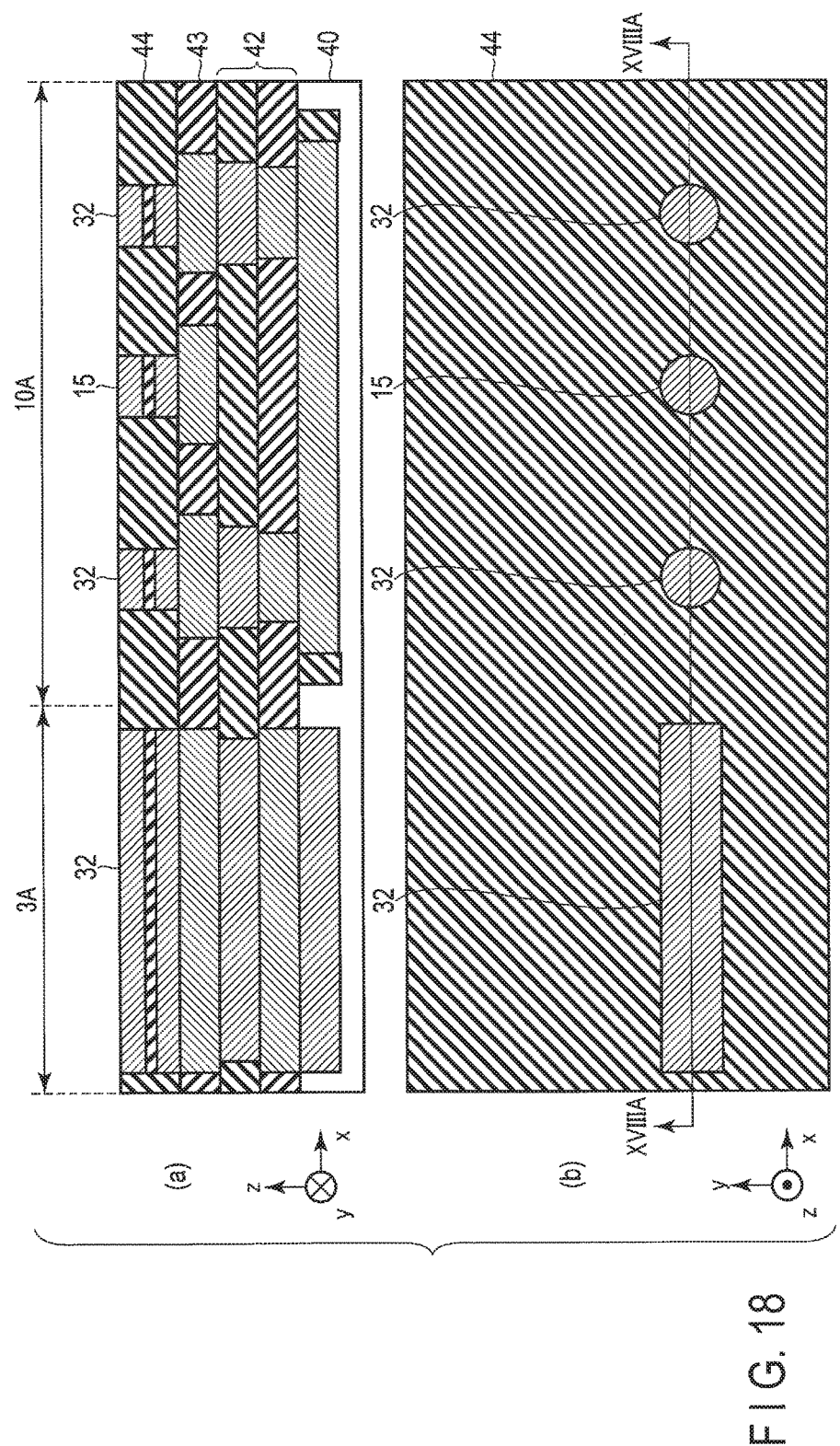
FIG. 18 is a schematic view showing a portion of the manufacturing method of the magnetic storage device according to the second embodiment.

As shown in FIG. 18, the ferromagnetic film 51*a*, the nonmagnetic film 52*a*, and the ferromagnetic film 53*a* are removed by a process similar to that in FIG. 10 through etching while leaving areas where the magnetoresistive effect element 15 or the dummy magnetoresistive effect element 32 is planned to be disposed. As a result, the magnetoresistive effect element 15 and a plurality of the dummy magnetoresistive effect elements 32 are disposed. A dielectric film 44 is deposited in areas from which the ferromagnetic film 51*a*, the nonmagnetic film 52*a*, and the ferromagnetic film 53*a* have been removed.

Figure 19:
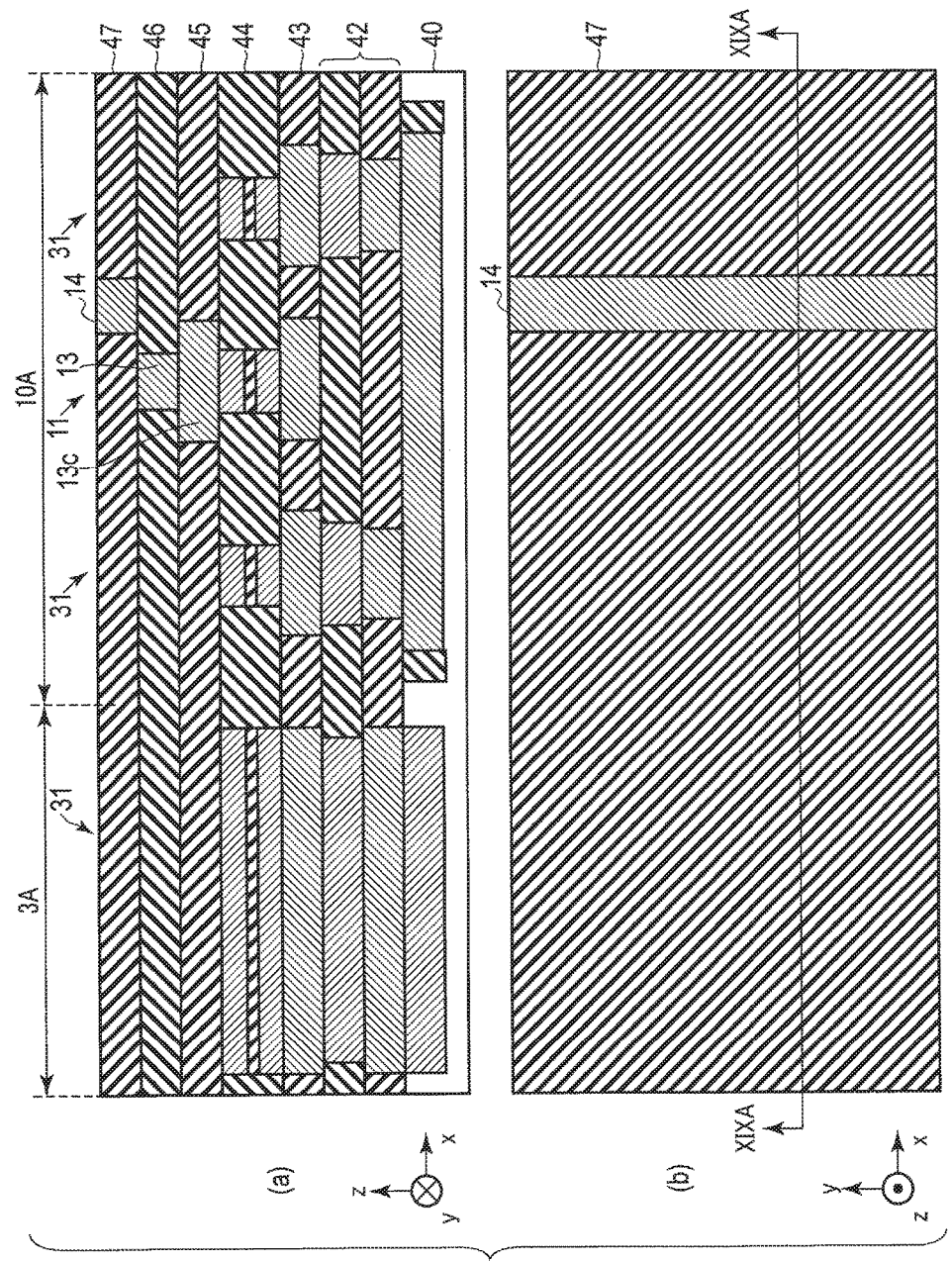
FIG. 19 is a schematic view showing a portion of the manufacturing method of the magnetic storage device according to the second embodiment.

As shown in FIG. 19, a dielectric film 45 is deposited by a process similar to that in FIG. 11 all over the surface of the structure obtained by the processes heretofore. The dielectric film 45 is removed from an area where a bit line contact 13*c* is planned to be disposed. A conductive film is deposited in the area where the bit line contact 13*c* is planned to be disposed. Subsequently, a dielectric film 46 is deposited all over the surface of the structure obtained by the processes heretofore. The dielectric film 46 is removed by etching based on, for example, RIE from an area where the conductive film (bit line) is disposed to deposit the bit line 13. An area where a source line contact 14*c* is disposed of the dielectric films 42 to 46 is removed by etching to dispose a trench. The diffusion area 18 on the surface of the semiconductor substrate 40 is exposed by etching from the bottom of the trench. A conductive film (source line contact 14*c*) is deposited in the trench. Subsequently, the conductive film (source line) 14 and a dielectric film 47 are disposed.

Figure 20:
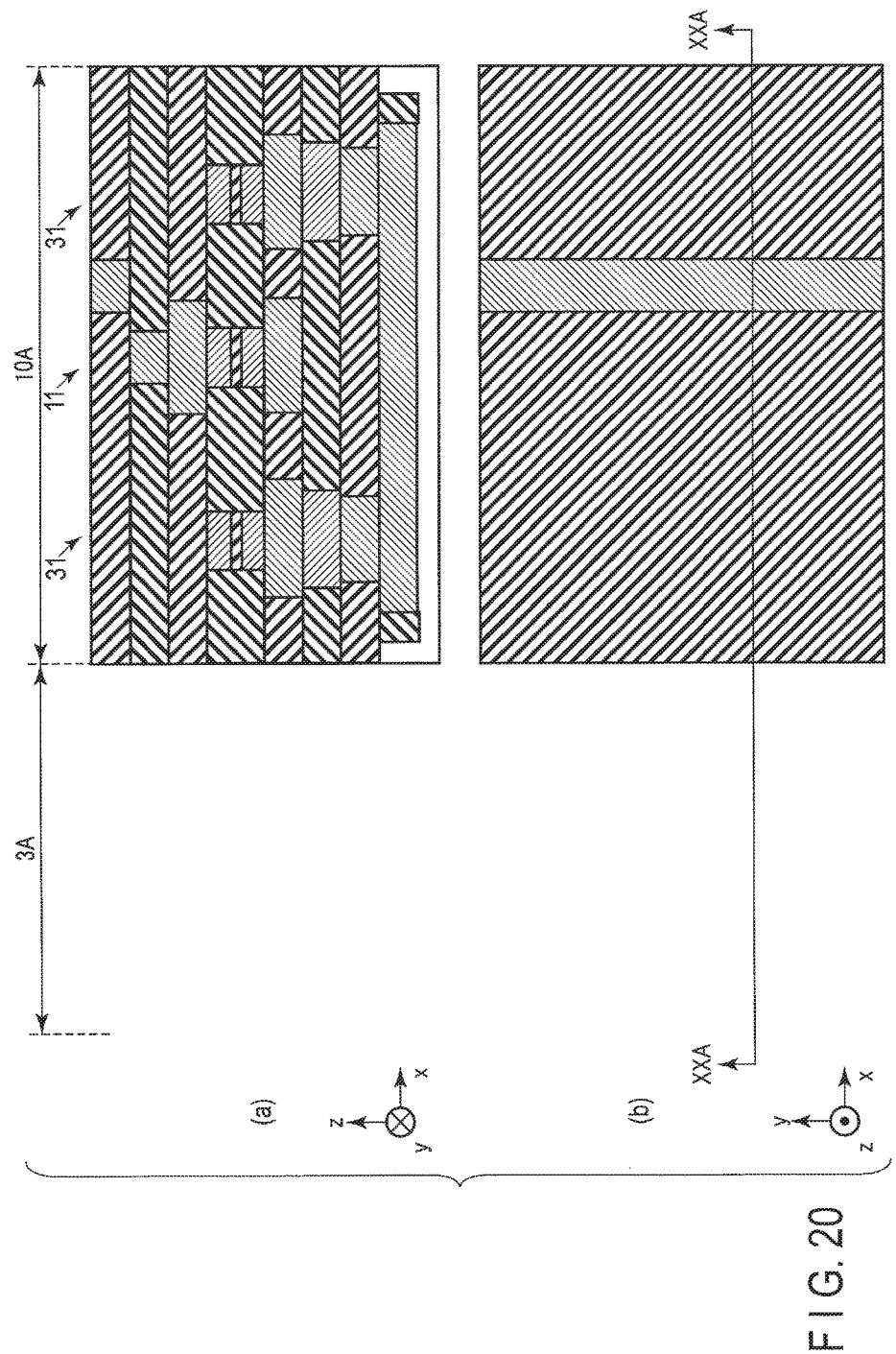
FIG. 20 is a schematic view showing a portion of the manufacturing method of the magnetic storage device according to the second embodiment.

As shown in FIG. 20, the wafer 1 is cut on a scribe line 3 to obtain the structure of the magnetic storage device 2 having the dummy cell 31 and the memory cell 11 by undergoing a process similar to that in FIG. 12.

2.3 Effects According to the Present Embodiment

A magnetoresistive effect element is formed such that the resistance value characteristics RA and MR ratio that are desirable are obtained. To determine whether the resistance value characteristics RA and MR ratio that are desirable are obtained for a formed magnetoresistive effect element 15, for example, a method of measuring the resistance value characteristics RA and MR ratio by CIPT is proposed. Actually, for example, CIPT measurements are made on a structure before being processed into the magnetoresistive effect element 15 by etching. More specifically, as shown in FIG. 21, CIPT measurements are made on a ferromagnetic layer 101, a tunnel barrier layer 102, and a ferromagnetic layer 103 that are stacked. A terminal of the probe 36 is brought into contact with such a laminated structure to apply a voltage between a plurality of terminals inside the probe 36. As a result of application, the value of a current flowing when not passing through the tunnel barrier layer 102 and the value of a current flowing when passing through the tunnel barrier layer 102 are measured to finally estimate the resistance value characteristics RA and MR ratio. In the stage of, for example, an experiment in CIPT measurements, the path of a current flowing through an area below the tunnel barrier layer 102 can be secured by disposing a conductive layer having a large area below the ferromagnetic layer 101. As a result, correct CIPT measurements can be made.

On the other hand, CIPT measurements may be made in the manufacturing process of a magnetic storage device to be a product. In this manner, performance of a magnetic storage device to be a product can be measured. In this case, in the stage of making CIPT measurements, a current path available for CIPT measurement is not disposed. For example, the lower electrode 16*c* disposed below the magnetoresistive effect element 15 is shorter than the inter-terminal distance (for example, a length longer than 1.5 μm and shorter than 35 μm) of the probe 36 and no more than about 0.1 μm. Thus, a conductive layer 104 (or a contact 106) is not appropriate as a path on which a current from the probe 36 is passed. That is, the lower combined electric resistivity $R_B$ is small. As a result, the value of a current flowing when passing through the tunnel barrier layer 102 is not correctly measured and by extension, CIPT measurements may not correctly be made. Therefore, there is room for further studies regarding the fact that a wafer from which magnetic storage devices are manufactured does not satisfy conditions for allowing precise measurements of the resistance value characteristics RA and MR ratio.

According to the second embodiment, the conductive layer 48 and the dummy contact 33 function as a current path between bottom surfaces of the plurality of connection areas 37 disposed in the same layer as the magnetoresistive effect element 15. Accordingly, a current path on which the value of the electric resistivity is small can be disposed below the magnetoresistive effect element layer 60 for CIPT measurement. That is, the conductive layer 48 and the dummy contact 33 function as a current path available for CIPT measurement on the bottom surface of the magnetoresistive effect element layer 60. Therefore, the magnetic storage device 2 capable of measuring the resistance value characteristics RA and MR ratio with precision can be provided.

Also, according to a first mode of the second embodiment, the conductive layer 48 has an electric resistivity lower than that of the dummy contact 33. Accordingly, the lower combined electric resistivity $R_B$ can be set low even if a material whose electric resistivity is low like, for example, copper (Cu) cannot be used for the dummy contact 33. Therefore, the resistance value characteristics RA and MR ratio can be measured with precision.

Also, according to a second mode of the second embodiment, the conductive layer 48 is disposed by the surface of the semiconductor substrate 40 being silicified. The conductive layer 48 may also be disposed by ion implantation into the surface of the semiconductor substrate 40 or embedding copper (Cu). Accordingly, in addition to wirings for the memory cell 11, only the dummy contact 33 needs to be disposed in a wiring layer. Therefore, changing the arrangement of wiring for the memory cell 11 can be reduced.

Also, according to a third mode of the second embodiment, the magnetoresistive effect element 15 is disposed on a straight line connecting top surfaces of the dummy contacts 33. Accordingly, an area around the dummy cell 31 and the conductive layer 48 can be utilized as an area for the memory cell 11. Therefore, CIPT measurements can be made more efficiently on the wafer 1 from which the magnetic storage device 2 is manufactured.

Also, the second embodiment can further achieve effects similar to those of the first embodiment.

3. Third Embodiment

Next, a magnetic storage device according to the third embodiment will be described. The magnetic storage device according to the third embodiment can make CIPT measurements of a magnetoresistive effect element further including a shift cancelling layer. Hereinafter, different portions from the second embodiment will be described and the description of similar portions is omitted.

3.1 Configuration of Magnetoresistive Effect Element

Figure 22:
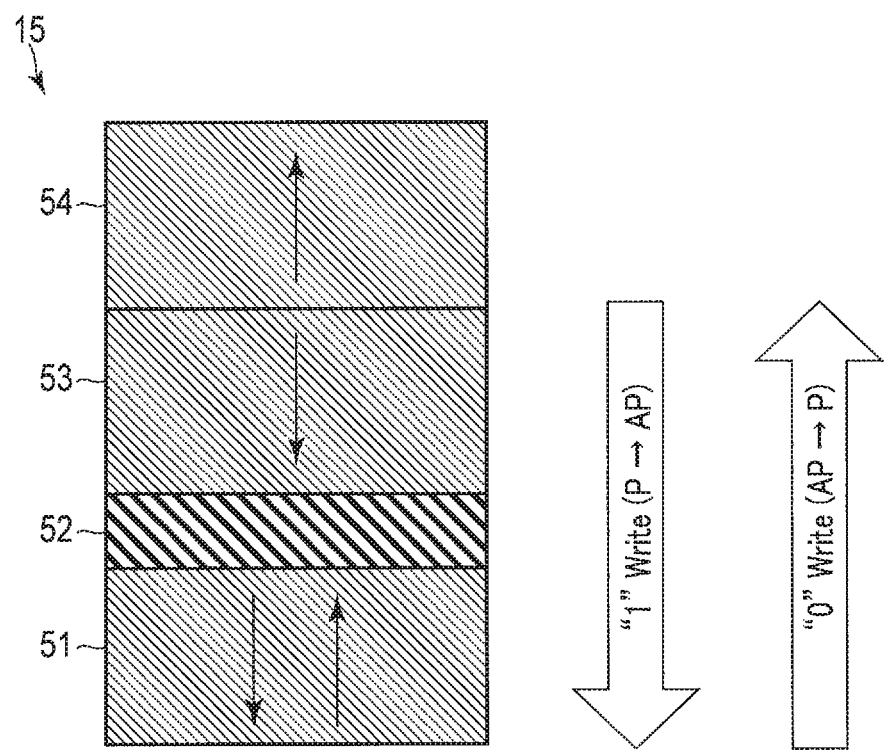
FIG. 22 is a sectional view showing the configuration of the magnetoresistive effect element of the magnetic storage device according to a third embodiment.

First, the configuration of a magnetoresistive effect element of a magnetic storage device according to the third embodiment will be described using FIG. 22. FIG. 22 is a schematic view showing the configuration of a magnetoresistive effect element 15 of a magnetic storage device 2 according to the third embodiment. As shown in FIG. 22, the magnetoresistive effect element 15 includes a storage layer 51, a tunnel barrier layer 52, a reference layer 53, and a shift cancelling layer 54 as a third ferromagnetic layer. In the magnetoresistive effect element 15, the storage layer 51, the tunnel barrier layer 52, the reference layer 53, and the shift cancelling layer 54 are stacked in this order from the side of the semiconductor substrate 40. In a dummy cell 31, the shift cancelling layer 54 is not necessarily stacked. More specifically, the dummy cell 31 disposed on the scribe line 3 does not have the shift cancelling layer 54 stacked.

The shift cancelling layer 54 is a ferromagnetic layer having an easy axis of magnetization in a direction perpendicular to the film surface. The magnetization orientation of the shift cancelling layer 54 is fixed to a direction antiparallel to the magnetization orientation of the reference layer 53. The shift cancelling layer 54 has a function to suppress the influence of a stray field from the reference layer 53 on the storage layer 51.

3.2 Manufacturing Method

Figure 23:
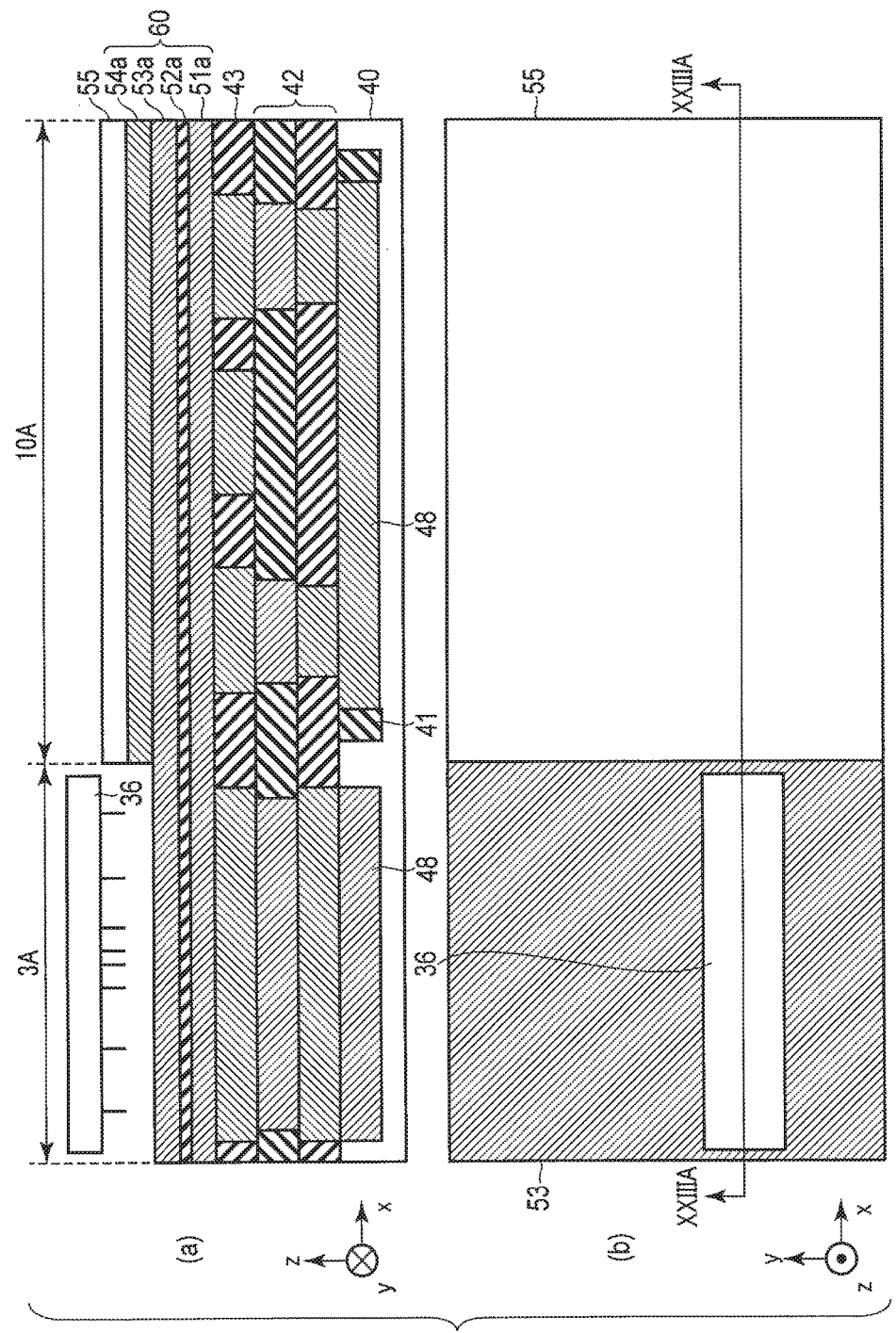
FIG. 23 is a schematic view showing a portion of the manufacturing method of the magnetic storage device according to the third embodiment.
Figure 24:
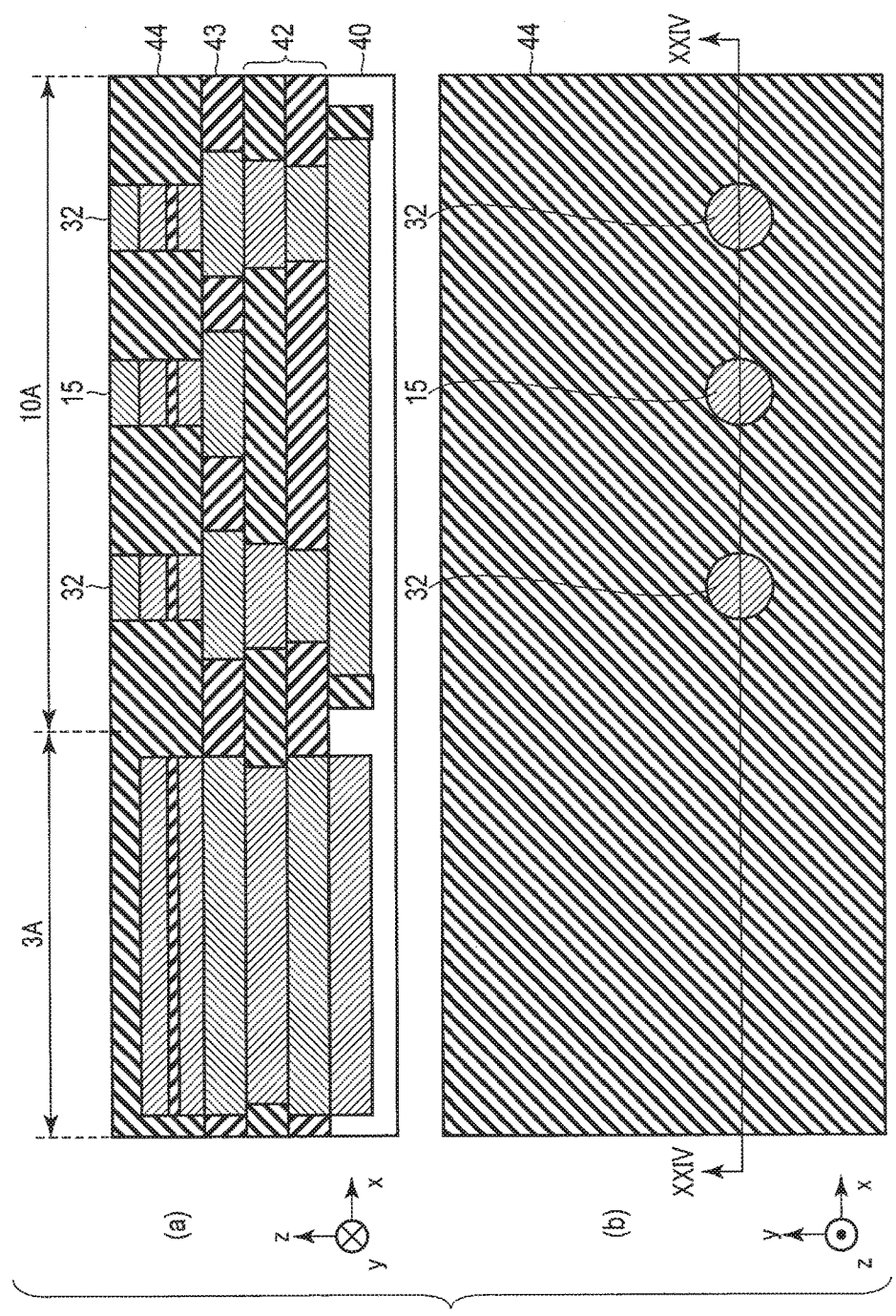
FIG. 24 is a schematic view showing a portion of the manufacturing method of the magnetic storage device according to the third embodiment.

Next, the manufacturing method of magnetic storage device according to the third embodiment will be described using FIGS. 23 and 24. FIGS. 23(a) and 24(a) are sectional views of a scribe line area 3A and a cell array area 10 of the magnetic storage device 2 according to the third embodiment in the xz plane. FIGS. 23(b) and 24 (b) are top views viewing the scribe line area 3A and the cell array area 10A downward from above shown in FIGS. 23(a) and 24(a). FIGS. 23 (a) and 24(a) show cross sections along a XXIII-XXIII line and a XXIV-XXIV line respectively. It is assumed that a memory cell 11 and the dummy cell 31 shown in FIGS. 23 and 24 are arranged in the same physical relationship as that of the memory cell 11 and the dummy cell 31 shown in FIGS. 14 to 20 and the same cross section is shown.

First, STI 41, a conductive layer 48, and a diffusion area 18 are disposed on the surface of a semiconductor substrate 40 by processes similar to those in FIGS. 14 to 16. Subsequently, a dielectric film (gate dielectric film 19) and a conductive film (word line 12) are deposited to dispose a select transistor 17. Subsequently, dielectric films 42, 43 below a magnetoresistive effect element layer 60 are deposited to dispose a contact 16 and a dummy contact 33.

As shown in FIG. 23, a ferromagnetic film 51a, a nonmagnetic film 52a, a ferromagnetic film 53a, and a ferromagnetic film 54a as the magnetoresistive effect element layer 60 are stacked in this order all over the surface of the structure obtained by the processes heretofore. The ferromagnetic film 51a, the nonmagnetic film 52a, the ferromagnetic film 53a, and the ferromagnetic film 54a are stacked successively inside a chamber of a film forming device like, for example, a vacuum film forming device, that is, without a wafer 1 being taken out of the chamber. The ferromagnetic film 54a is a layer planned to function as the shift cancelling layer 54 by later etching. Subsequently, magnetization of the ferromagnetic film 51a, the nonmagnetic film 52a, the ferromagnetic film 53a, and the ferromagnetic film 54a is stabilized by heat treatment. Subsequently, a film 55 is further deposited on the top surface of the ferromagnetic film 54a. The film 55 functions as a hard mask to protect the ferromagnetic film 54a during CIPT measurement. Subsequently, after the wafer 1 is taken out of the vacuum film forming device, portions of the film 55 and the ferromagnetic film 54a deposited on the scribe line 3 are removed by etching. Accordingly, the ferromagnetic film 53a is exposed from the top surface of the scribe line 3. Subsequently, a current is passed from the top surface of the ferromagnetic film 53a via the probe 36 on the scribe line 3 to make CIPT measurements.

As shown in FIG. 24, after measurements of the resistance value characteristics RA and MR ratio are finished, the wafer 1 is put into the vacuum film forming device again to remove the film 55. Subsequently, the magnetoresistive effect element layer 60 is removed by etching while leaving areas where the magnetoresistive effect element 15 and the dummy magnetoresistive effect element 32 are planned to be disposed. A dielectric film 44 is deposited in an area from which the magnetoresistive effect element layer 60 has been removed. Hereinafter, a structure of the magnetic storage device 2 including the dummy cell 31 and the memory cell 11 is obtained by processes similar to those in FIGS. 19 and 20.

3.2 Effects According to the Present Embodiment

The MR ratio of resistance value characteristics of a magnetoresistive effect element is calculated based on values of RA in two resistance states. However, if the magnetoresistive effect element layer 60 includes the ferromagnetic film 54a, only resistance value characteristic RA in one resistance state of resistance states that can be assumed by the magnetoresistive effect element layer 60 can be measured by CIPT. To provide supplementary remarks, in CIPT measurement, the resistance value characteristic RA in one resistance state is measured while the magnetization orientation of the ferromagnetic film 51a is directed in a first direction. Subsequently, after the magnetization orientation of the ferromagnetic film 51a is inverted from the first direction to a second direction, the resistance value characteristic RA in the other resistance state is measured. However, if the magnetoresistive effect element layer 60 includes the ferromagnetic film 54a, it is difficult for the ferromagnetic film 51a to invert the magnetization orientation when CIPT measurements are made and thus, the MR ratio cannot be measured by CIPT while a layer planned to function as the shift cancelling layer 54 is formed.

On the other hand, in order to make CIPT measurements before a layer planned to function as the shift cancelling layer 54 is formed, it is necessary to make CIPT measurements by taking a wafer on which up to a layer planned to function as the reference layer 53 has been formed out of the vacuum film forming device. Thus, the surface of a layer planned to function as the reference layer 53 may be contaminated under the influence of moisture, the atmosphere and the like when CIPT measurements are made and it is difficult to maintain cleanliness. Therefore, it is difficult to make CIPT measurements before a layer planned to function as the shift cancelling layer 54 is formed while maintaining the magnetoresistive effect element layer 60 in state capable of functioning as a memory element.

According to the third embodiment, in addition to the second embodiment, the resistance value characteristics RA and MR ratio are measured on the top surface of the ferromagnetic film 53a exposed after the ferromagnetic film 54a on the scribe line 3 is removed. An area where the resistance value characteristics RA and MR ratio are measured of the magnetoresistive effect element layer 60 is on the scribe line 3 and removed later. Thus, a portion on the scribe line 3 of the magnetoresistive effect element layer 60 is not used as the magnetoresistive effect element 15 and so does not affect performance of the magnetic storage device 2. Accordingly, CIPT measurements can be made on the wafer 1 of the magnetic storage device 2 including the shift cancelling layer 54 without damaging the function of the magnetoresistive effect element 15. Therefore, the resistance value characteristics RA and MR ratio of the magnetoresistive effect element 15 can be measured without manufacturing wafers for CIPT measurement.

Also, the third embodiment can further achieve, in addition to effects of the second embodiment, effects similar to those of the first embodiment.

4. Fourth Embodiment

Next, a magnetic storage device according to the fourth embodiment will be described. The magnetic storage device according to the fourth embodiment can reduce contact resistance between a magnetoresistive effect element layer and a probe when CIPT measurements are made. Hereinafter, different portions from the second embodiment will be described and the description of similar portions is omitted.

4.1 Manufacturing Method

First, the manufacturing method of magnetic storage devices according to the fourth embodiment will be described using FIG. 25. FIG. 25(a) is a sectional view of a scribe line area 3A and a cell array area 10A of a magnetic storage device 2 according to the fourth embodiment in the xz plane. FIG. 25(b) is a top view viewing the scribe line area 3A and the cell array area 10A downward from above shown in FIG. 25(a). Also, FIG. 25(a) shows a cross section along a XXV-XXV line. It is assumed that a memory cell 11 and the dummy cell 31 shown in FIG. 25 are arranged in the same physical relationship as that of the memory cell 11 and the dummy cell 31 shown in FIGS. 14 to 20 and the same cross section is shown.

First, STI 41, a conductive layer 48, and a diffusion area 18 are disposed on the surface of a semiconductor substrate 40 by processes similar to those in FIGS. 14 to 16. Subsequently, a dielectric film (gate dielectric film 19) and a conductive film (word line 12) are deposited to dispose a select transistor 17. Subsequently, dielectric films 42, 43 below a magnetoresistive effect element layer 60 are deposited to dispose a contact 16 and a dummy contact 33.

Figure 25:
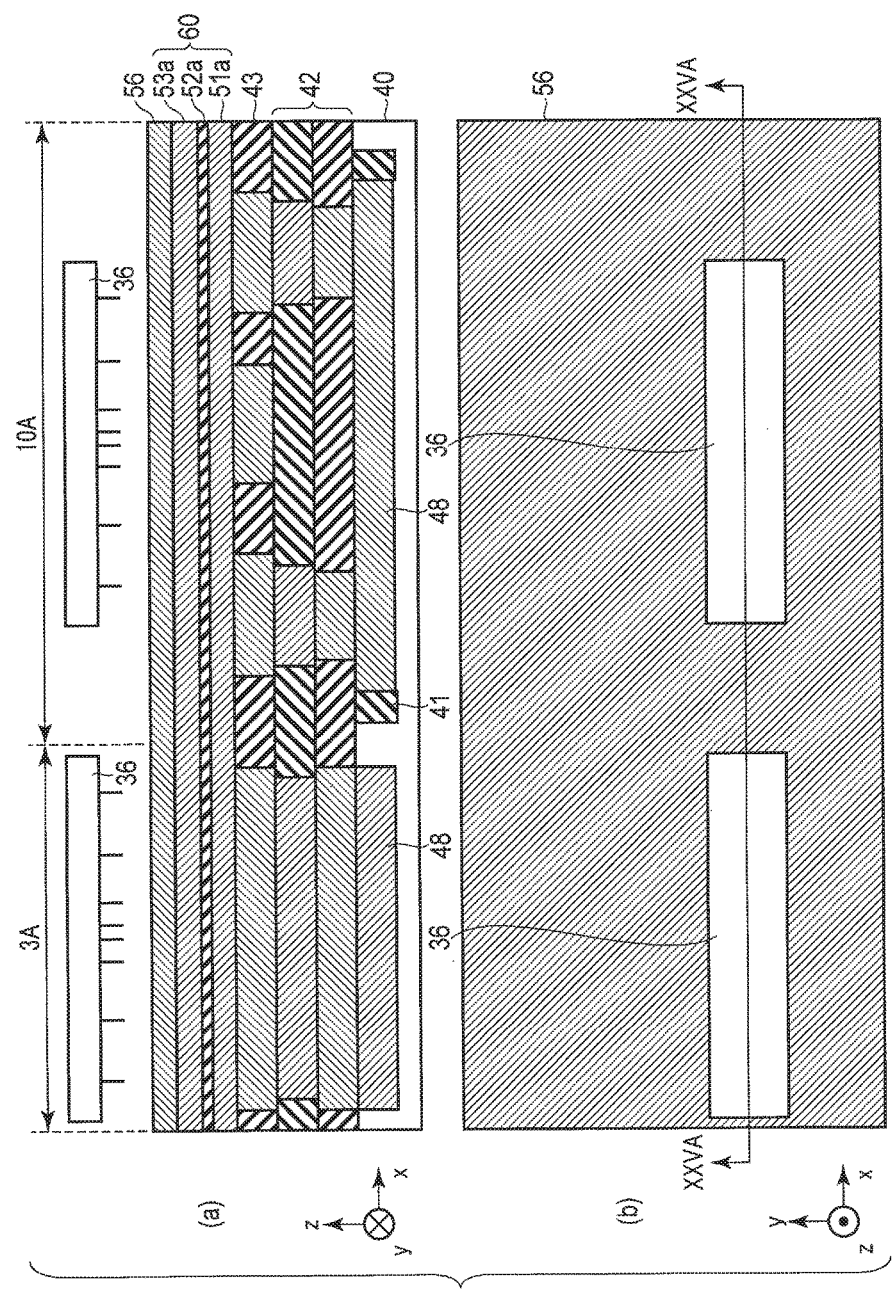
FIG. 25 is a schematic view showing a portion of the manufacturing method of the magnetic storage device according to a fourth embodiment.

As shown in FIG. 25, the magnetoresistive effect element layer 60, that is, a ferromagnetic film 51a, a nonmagnetic film 52a, and a ferromagnetic film 53a are stacked in this order all over the surface of the structure obtained by the processes heretofore. Subsequently, magnetization of the ferromagnetic film 51a, the nonmagnetic film 52a, and the ferromagnetic film 53a is stabilized by heat treatment. Subsequently, a conductive film 56 as a second conductive layer is further deposited on the top surface of the ferromagnetic film 53a. The conductive film 56 is desirably a precious metal like, for example, ruthenium (Ru) to reduce contact resistance between a probe 36 and the ferromagnetic film 53a. When ruthenium (Ru) is deposited, the conductive film 56 is desirably deposited about, for example, 7 nm. Subsequently, a current is passed from the top surface of the conductive film 56 via the probe 36 to make CIPT measurements.

After measurements of the resistance value characteristics RA and MR ratio are finished, the conductive film 56 is removed. Hereinafter, a structure of the magnetic storage device 2 including the dummy cell 31 and the memory cell 11 is obtained by processes similar to those in FIGS. 18 to 20.

4.2 Effects According to the Present Embodiment

According to the fourth embodiment, in addition to the second embodiment, CIPT measurements are made after the conductive film 56 is further deposited on the top surface of a layer planned to function as a reference layer 53. Accordingly, contact resistance between each terminal of the probe 36 and the magnetoresistive effect element layer 60 can be reduced. Therefore, the resistance value characteristics RA and MR ratio can be measured with more precision.

Also, the fourth embodiment can further achieve, in addition to effects of the second embodiment, effects similar to those of the first embodiment and the third embodiment.

5. Fifth Embodiment

Next, a magnetic storage device according to the fifth embodiment will be described. The magnetic storage device according to the fifth embodiment makes CIPT measurements after magnetization is stabilized by temporarily stacking a magnetic layer additionally when magnetization of a magnetoresistive effect element layer 60 is not sufficiently stabilized by heat treatment. Hereinafter, different portions from the second embodiment will be described and the description of similar portions is omitted.

5.1 Manufacturing Method

First, the manufacturing method of magnetic storage device according to the fifth embodiment will be described using FIG. 26. FIG. 26(a) is a sectional view of a scribe line area 3A and a cell array area 10A of a magnetic storage device 2 according to the fifth embodiment in the xz plane. FIG. 26(b) is a top view viewing the scribe line area 3A and the cell array area 10A downward from above shown in FIG. 26(a). Also, FIG. 26(a) shows a cross section along a XXVI-XXVI line. It is assumed that a memory cell 11 and a dummy cell 31 shown in FIG. 26 are arranged in the same physical relationship as that of the memory cell 11 and the dummy cell 31 shown in FIGS. 14 to 20 and the same cross section is shown.

First, STI 41, a conductive layer 48, and a diffusion area 18 are disposed on the surface of a semiconductor substrate 40 by processes similar to those in FIGS. 14 to 16. Subsequently, a dielectric film (gate dielectric film 19) and a conductive film (word line 12) are deposited to dispose a select transistor 17. Subsequently, dielectric films 42, 43 below the magnetoresistive effect element layer 60 are deposited to dispose a contact 16 and a dummy contact 33.

Figure 26:
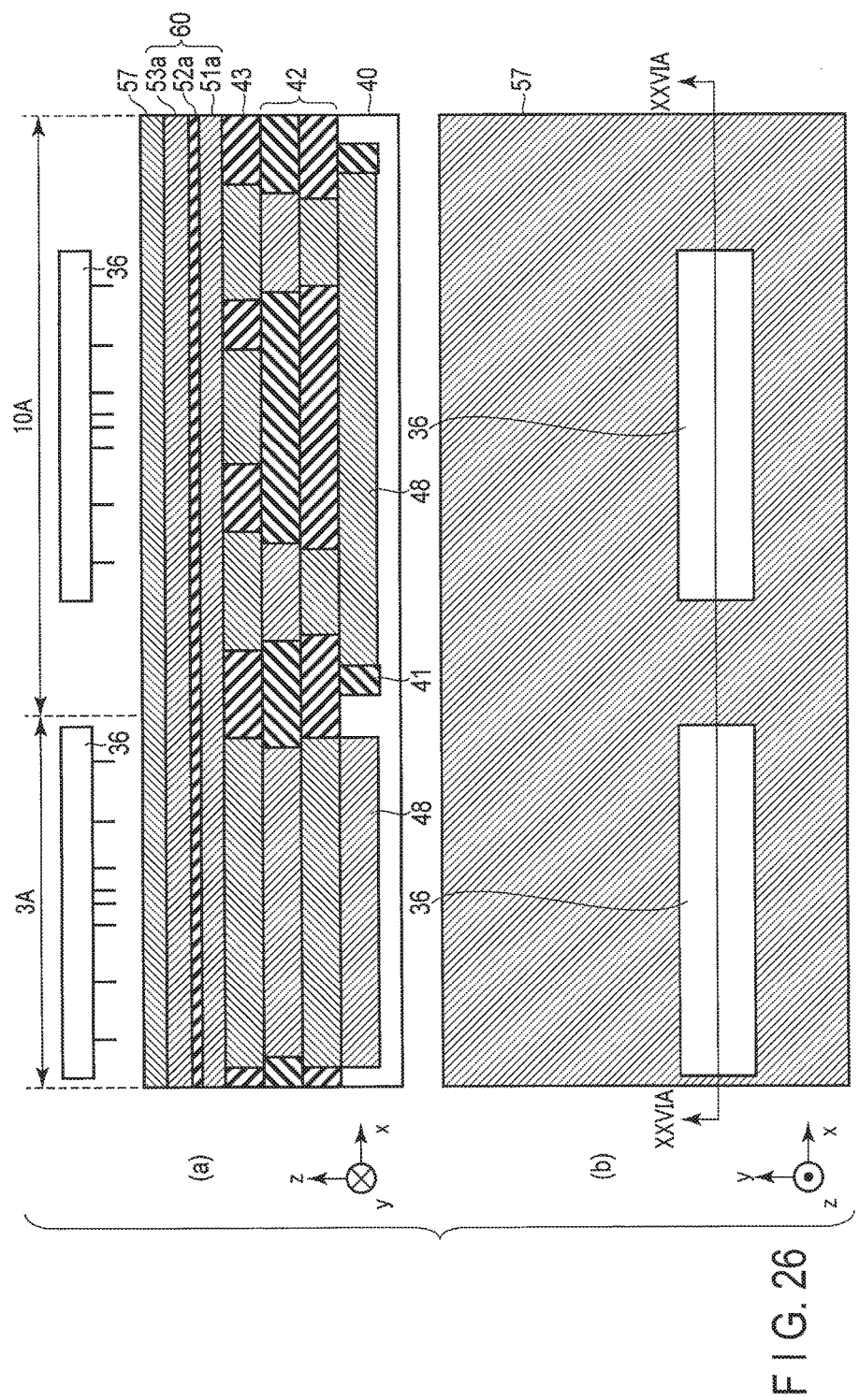
FIG. 26 is a schematic view showing a portion of the manufacturing method of the magnetic storage device according to a fifth embodiment.

As shown in FIG. 26, the magnetoresistive effect element layer 60, that is, a ferromagnetic film 51a, nonmagnetic film 52a, and a ferromagnetic film 53a are stacked in this order all over the surface of the structure obtained by the processes heretofore. Subsequently, it is assumed that the ferromagnetic film 51a, the nonmagnetic film 52a, and the ferromagnetic film 53a are thermally treated, but magnetization thereof is not sufficiently stabilized. Subsequently, a ferromagnetic film 57 as a fourth ferromagnetic layer is further deposited on the top surface of the ferromagnetic film 53a. The ferromagnetic film 57 stabilizes magnetization of the magnetoresistive effect element layer 60. Subsequently, a current is passed from the top surface of the ferromagnetic film 57 via a probe 36 to make CIPT measurements.

After measurements of the resistance value characteristics RA and MR ratio are finished, the ferromagnetic film 57 is removed. Hereinafter, a structure of the magnetic storage device 2 including the dummy cell 31 and the memory cell 11 is obtained by processes similar to those in FIGS. 18 to 20.

5.2 Effects According to the Present Embodiment

According to the fifth embodiment, in addition to the second embodiment, CIPT measurements are made after the ferromagnetic film 57 is further deposited on the top surface of a reference layer 53. Accordingly, even if magnetization of the magnetoresistive effect element layer 60 cannot be sufficiently stabilized by heat treatment, magnetization can be stabilized before CIPT measurements are made. Therefore, the resistance value characteristics RA and MR ratio can be measured with more precision.

Also, the fifth embodiment can further achieve, in addition to effects of the second embodiment, effects similar to those of the first embodiment, the third embodiment, and the fourth embodiment.

6. Another Embodiment

Figure 27:
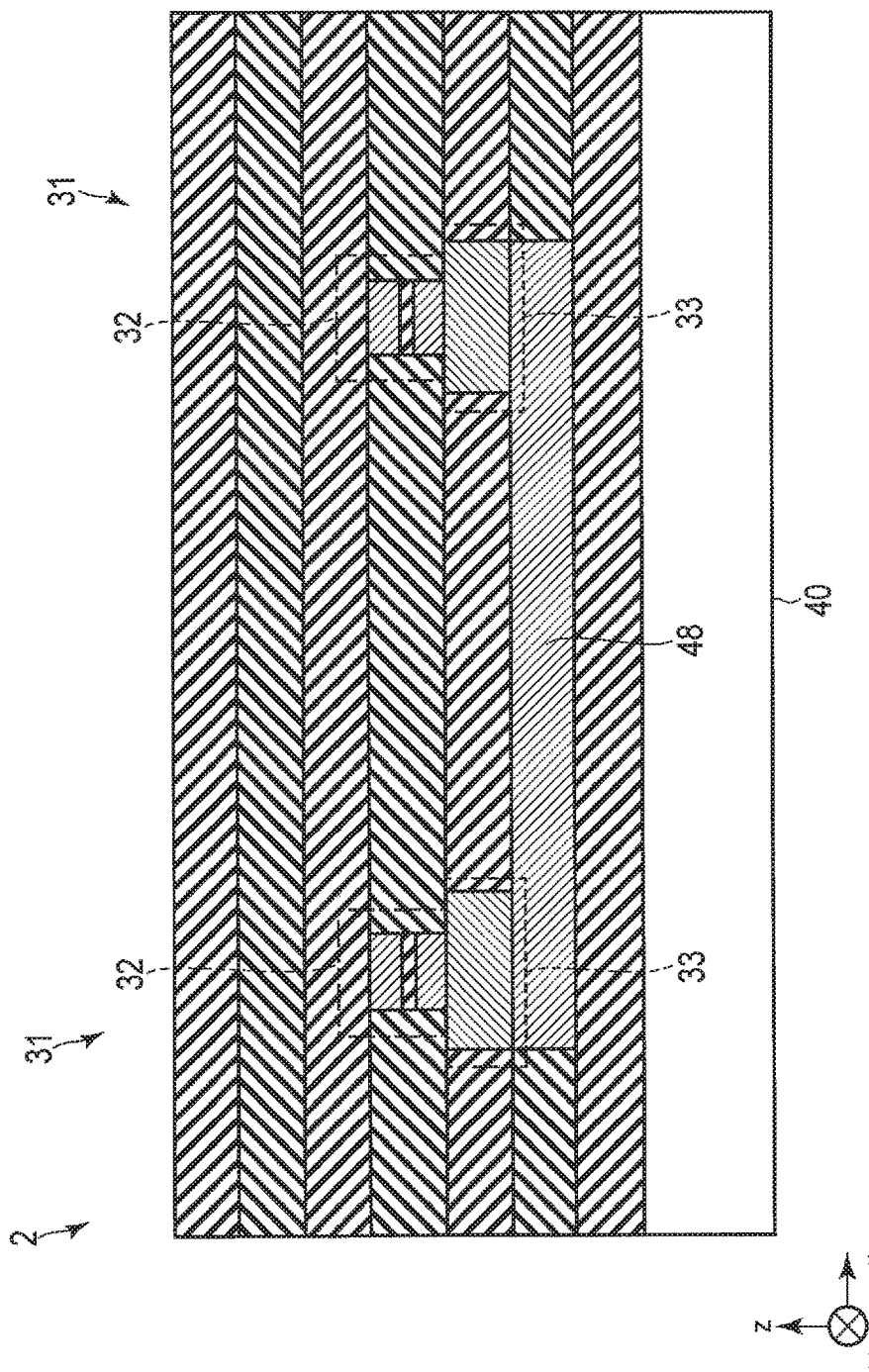
FIG. 27 is a sectional view showing a configuration example of the memory cell and the dummy cell of the magnetic storage device according to another embodiment.

The conductive layer 48 of the magnetic storage device 2 described in the second to fifth embodiments above has been described when disposed on the surface of the semiconductor substrate 40, but is not limited to such a case. FIG. 27 is a schematic view showing the circuit configuration of a memory cell 11 and a dummy cell 31 of a magnetic storage device 2 according to another embodiment and a sectional view when the memory cell 11 and a plurality of the dummy cells 31 adjacent to each other in the x direction are cut by the xz plane. As shown in FIG. 27, a conductive layer 48 may be disposed above the top surface of a semiconductor substrate 40. In this case, a material of low electric resistivity like, for example, copper (Cu) is used for the conductive layer 48.

According to the other embodiment, the conductive layer 48 is disposed above the top surface of the semiconductor substrate 40. Accordingly, if there is room for an area that does not interfere with wirings of the memory cell 11, the lower combined electric resistivity $R_B$ can be set still lower by disposing the conductive layer 48 in the area. Therefore, the resistance value characteristics RA and MR ratio can be measured with more precision. Also, even if the above configuration cannot be adopted in an area where the magnetic storage device 2 is disposed, a manufacturing method capable of making CIPT measurements on a wafer 1 on which the magnetic storage device 2 is disposed can be performed by adopting the above configuration, for example, on a scribe line 3.

The memory cell 11 described in the second to fifth embodiments above has been described in a case of being disposed between the dummy cells 31, but is not limited to such a case and may be provided in a position away from the dummy cells 31.

Also, the magnetoresistive effect element 15 described in each of the above embodiments has been described in a case of perpendicular magnetization MTJ, but is not limited to such a case and may be a horizontal magnetization MTJ element having horizontal magnetic anisotropy.

Also, the magnetoresistive effect element 15 described in each of the above embodiments has been described in a case of the bottom free type in which the storage layer 51 is disposed on the side of the semiconductor substrate 40, but may also be of the top free type in which the reference layer 53 is disposed on the side of the semiconductor substrate 40. However, if the magnetoresistive effect element 15 is of the top free type, only the resistance value characteristic RA in one resistance state of resistance states that can be assumed by the magnetoresistive effect element layer 60 can be measured in a configuration including the shift cancelling layer 54 shown by the third embodiment or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

What is claimed is:

1. A magnetic storage device comprising:
    a substrate;
    a dummy contact disposed on a top surface of the substrate, extending linearly in a direction substantially perpendicular to the top surface of the substrate, and floating electrically;
    a magnetoresistive effect element included in a layer and insulated from the dummy contact, wherein the layer is disposed on a top surface of the dummy contact;

a lower electrode disposed on a bottom surface of the magnetoresistive effect element; and an insulating layer disposed between the top surface of the substrate and a bottom surface of the lower electrode, wherein the magnetoresistive effect element is laterally displaced from the dummy contact, and wherein the following relationship is satisfied:

$$d2/d1 \leq TC\_MTJ/TC\_IL$$

where:
- d2 is a lateral distance between the lower electrode and a portion of the dummy contact disposed in a position closest to the magnetoresistive effect element,
- d1 is a shortest vertical distance from the lower electrode to the semiconductor substrate,
- TC_MTJ is a first thermal conductivity of the magnetoresistive effect element, and
- TC_IL is a second thermal conductivity of the insulating layer.

2. The device of claim 1, wherein the substrate includes an element insulating area that insulates an area electrically connected to the dummy contact from an area electrically connected to the magnetoresistive effect element.

3. The device of claim 1, further comprising:
a dummy magnetoresistive effect element disposed in a same layer as the magnetoresistive effect element and insulated from the magnetoresistive effect element.

* * * * *